US010889896B2

(12) United States Patent
Nishimura et al.

(10) Patent No.: US 10,889,896 B2
(45) Date of Patent: Jan. 12, 2021

(54) ACTIVE GAS-GENERATING DEVICE AND FILM FORMATION APPARATUS

(71) Applicant: TOSHIBA MITSUBISHI-ELECTRIC INDUSTRIAL SYSTEMS CORPORATION, Chuo-ku (JP)

(72) Inventors: Shinichi Nishimura, Tokyo (JP); Kensuke Watanabe, Tokyo (JP); Yoshihito Yamada, Tokyo (JP)

(73) Assignee: TOSHIBA MITSUBISHI-ELECTRIC INDUSTRIAL SYSTEMS CORPORATION, Tokyo (JP)

( * ) Notice: Subject to any disclaimer, the term of this patent is extended or adjusted under 35 U.S.C. 154(b) by 154 days.

(21) Appl. No.: 16/309,024

(22) PCT Filed: Jun. 28, 2016

(86) PCT No.: PCT/JP2016/069091
§ 371 (c)(1),
(2) Date: Dec. 11, 2018

(87) PCT Pub. No.: WO2018/003002
PCT Pub. Date: Jan. 4, 2018

(65) Prior Publication Data
US 2019/0226091 A1 Jul. 25, 2019

(51) Int. Cl.
*C23C 16/50* (2006.01)
*H05H 1/24* (2006.01)
(Continued)

(52) U.S. Cl.
CPC .............. *C23C 16/50* (2013.01); *C01B 13/11* (2013.01); *C23C 16/505* (2013.01);
(Continued)

(58) Field of Classification Search
CPC ...... C23C 16/54; C23C 16/545; C23C 14/568; C23C 16/50; C23C 16/505; C23C 16/509;
(Continued)

(56) References Cited

U.S. PATENT DOCUMENTS

2002/0028286 A1* 3/2002 Sasaki .................. C23C 14/568
427/131
2006/0118242 A1* 6/2006 Herbert .................... C23F 4/00
156/345.43
(Continued)

FOREIGN PATENT DOCUMENTS

JP 2011-154973 A 8/2011
JP 2015-5780 A 1/2015

OTHER PUBLICATIONS

Taiwanese Office Action dated May 19, 2017 in Application No. 105125910, (with partial unedited machine-generated English language translation).
(Continued)

*Primary Examiner* — Rudy Zervigon
(74) *Attorney, Agent, or Firm* — Xsensus LLP

(57) ABSTRACT

With respect to a dielectric electrode, gas-jetting holes and gas-jetting holes formed in two rows along the X direction are provided as three or more gas-jetting holes along the X direction in a central region. By providing a difference in the X direction between the position where the gas-jetting hole is formed and the position where the gas-jetting hole is formed, the gas-jetting holes and the gas-jetting holes disposed in two rows are provided such that gas-jetting holes and gas-jetting holes are alternately disposed along the X direction.

10 Claims, 13 Drawing Sheets

(51) Int. Cl.
   *C23C 16/505*       (2006.01)
   *C01B 13/11*        (2006.01)
   *H01J 37/32*        (2006.01)

(52) U.S. Cl.
   CPC .. *H01J 37/32348* (2013.01); *H01J 37/32449* (2013.01); *H05H 1/24* (2013.01); *H01J 2237/3323* (2013.01)

(58) Field of Classification Search
   CPC ................. H05H 1/24; H05H 1/2406; H05H 2001/2418; H05H 2001/2431; C01B 13/11; H01J 37/32348; H01J 37/32449; H01J 2237/3323; H01J 37/32568
   USPC ............ 118/719, 723 E; 156/345.43, 345.44, 156/345.45, 345.46, 345.47, 345.31, 156/345.32
   See application file for complete search history.

(56) References Cited

U.S. PATENT DOCUMENTS

| | | | |
|---|---|---|---|
| 2010/0055347 A1 | 3/2010 | Kato et al. | |
| 2011/0005681 A1* | 1/2011 | Savas | H01J 37/32036 |
| | | | 156/345.33 |
| 2012/0255492 A1* | 10/2012 | Wu | H01J 37/32825 |
| | | | 118/723 E |

OTHER PUBLICATIONS

International Search Report dated Sep. 13, 2016 in PCT/JP2016/069091 filed Jun. 28, 2016.

\* cited by examiner

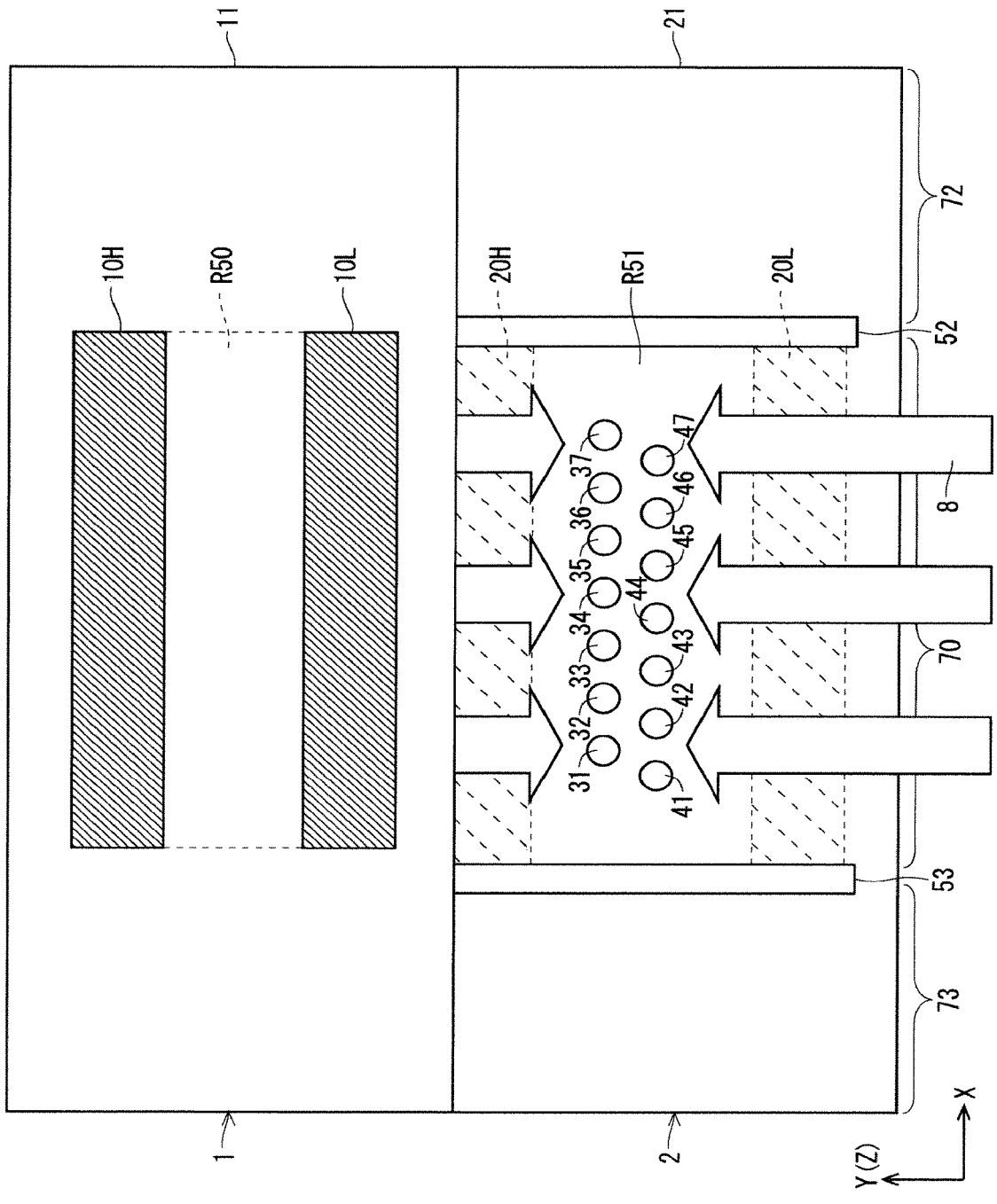

F I G . 4
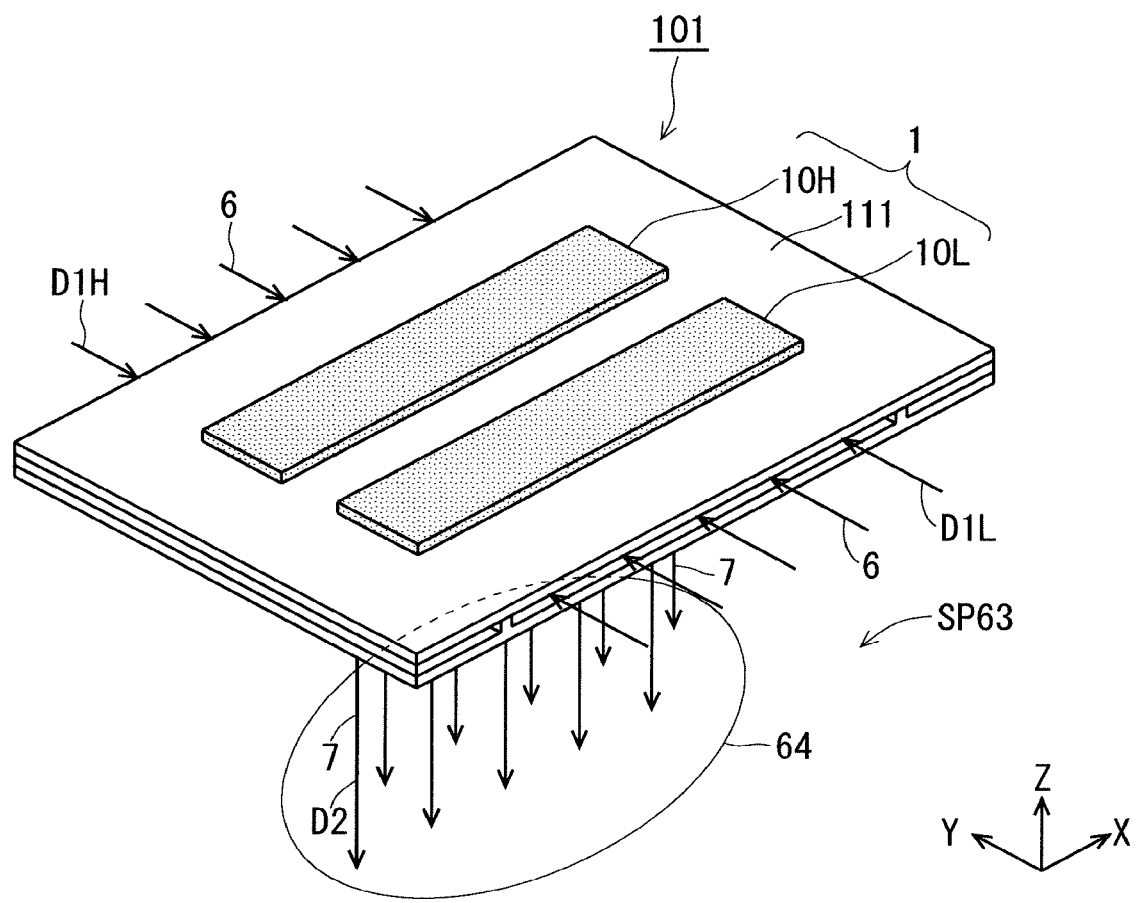

F I G . 8
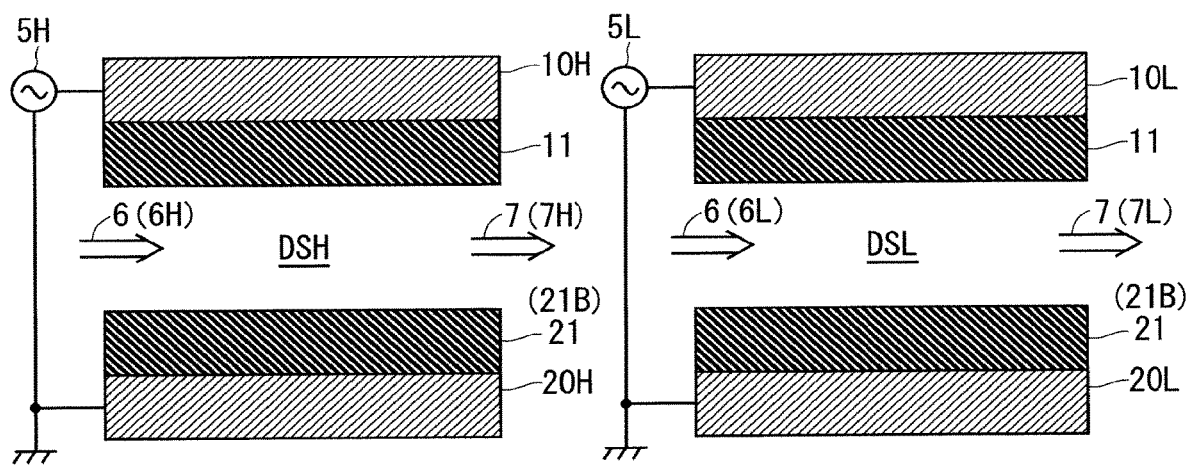

F I G. 9A
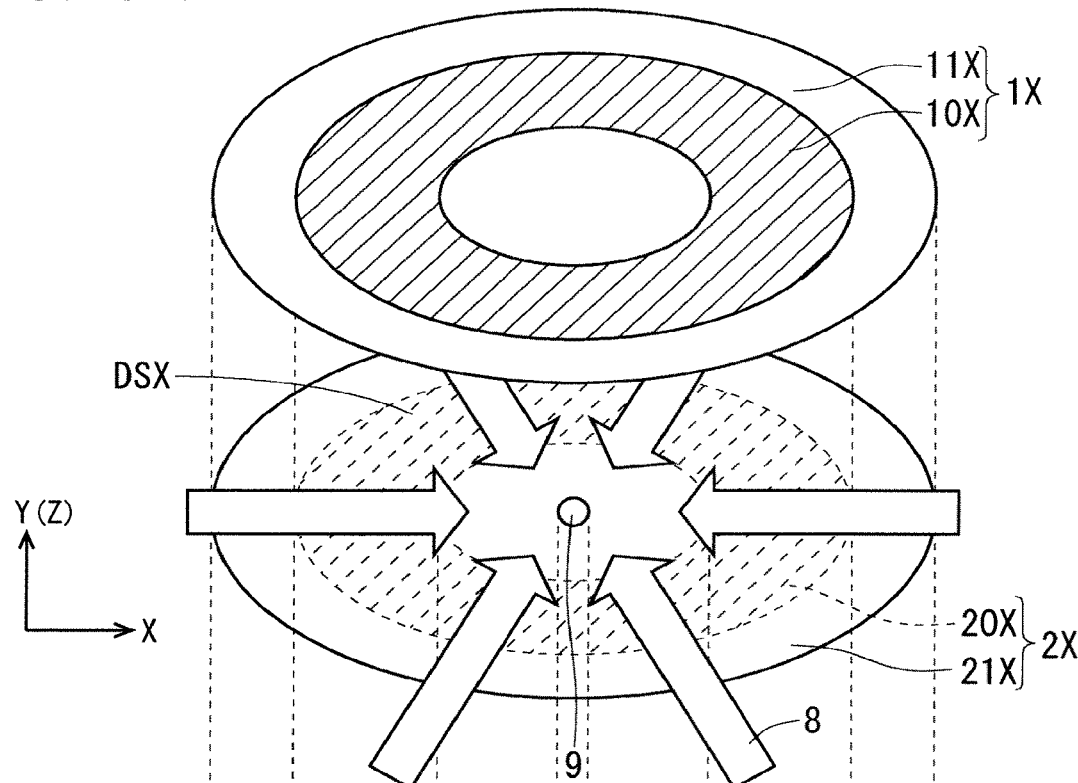
F I G. 9B
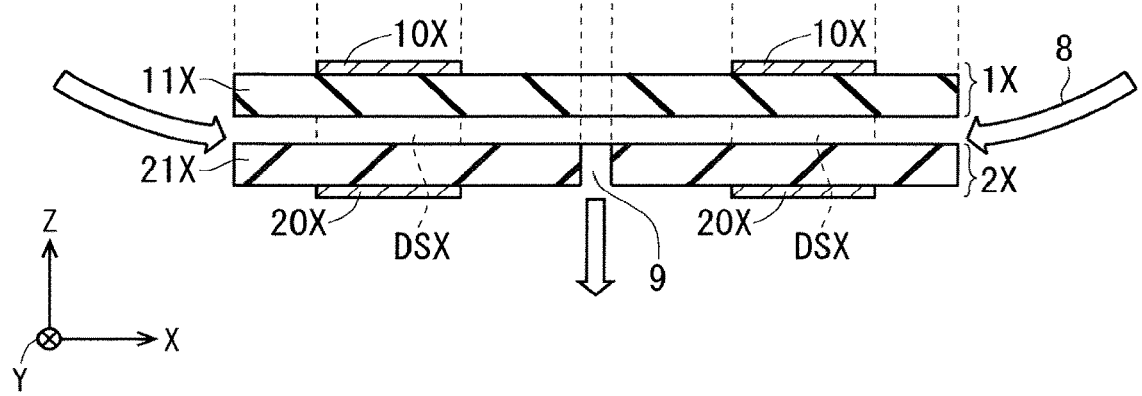

F I G . 1 2
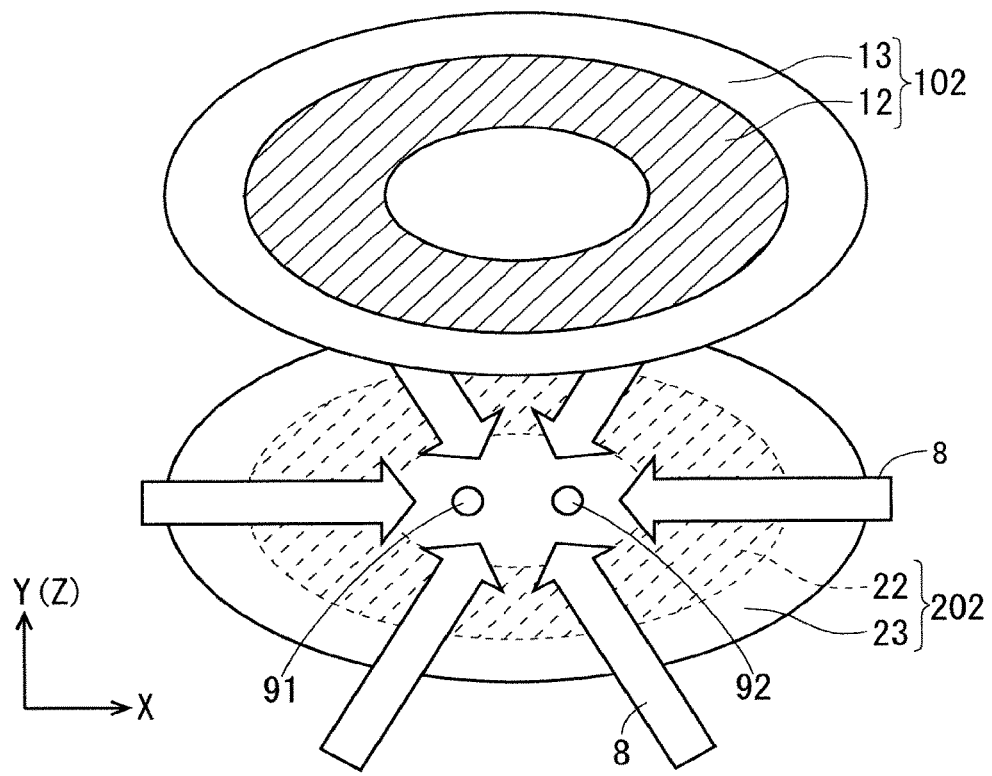
F I G . 1 3
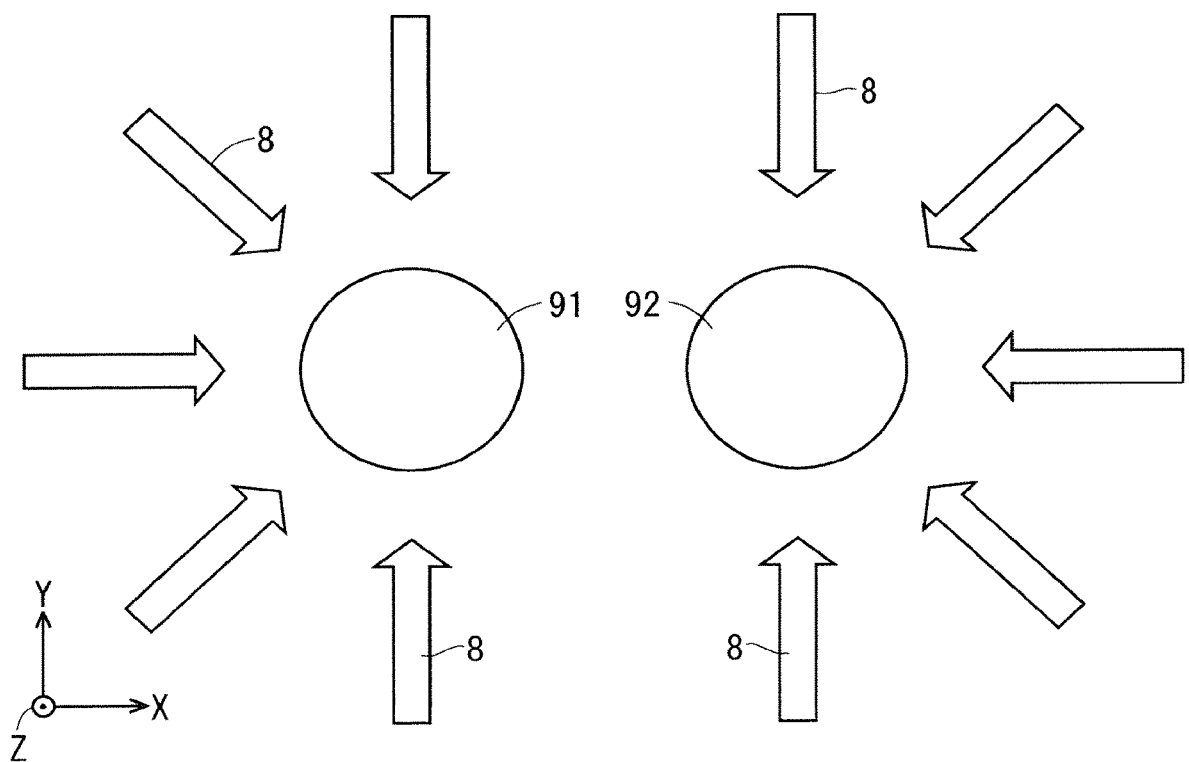

ACTIVE GAS-GENERATING DEVICE AND FILM FORMATION APPARATUS

TECHNICAL FIELD

The present invention relates to an active gas-generating device in which a high voltage dielectric electrode and a ground dielectric electrode are set in parallel to apply a high voltage between both the electrodes, and an active gas is obtained with energy generated by discharge.

BACKGROUND ART

In a conventional active gas-generating device, a metal electrode such as an Au film may be formed on a dielectric electrode made of ceramics or the like to form an electrode constituent part. In such a device, the dielectric electrode in the electrode constituent part is a main component, and the metal electrode formed thereon is dependent.

One of the conventional active gas-generating devices is an active gas-generating device in which a disk-shaped electrode constituent part including a disk-shaped high voltage dielectric electrode and a disk-shaped ground dielectric electrode disposed in parallel to each other is used; and a source gas penetrating from an outer peripheral part to an inside passes through a discharge space (discharge field) and is jetted from only one gas-jetting hole provided in a central part of the electrode to an outside.

In a case where there is only one gas-jetting hole, it is considered that the entirety of the source gas to be supplied can pass through the discharge space and receive energy for an identical time; however, in a case where a plurality of gas-jetting holes is provided, countermeasures such as devising the shape of the electrode is necessary.

In the case of generating an active gas by applying energy to a source gas by using dielectric barrier discharge (silent discharge or creeping discharge), it is desirable that staying time of the gas in the discharge space be constant in the entirety of the source gas. The reason is that when the staying time of the source gas in the discharge space is uneven, there is a difference in the amount and the concentration of the active gas. Therefore, there is a possibility that when the active gas is supplied to a substrate to be treated such as a wafer subjected to a film formation treatment, film formation results may not be constant.

Therefore, in a case where there is one gas-jetting hole or the like, a disk-shaped electrode structure or a cylindrical electrode structure is now used, and staying time of the source gas in the discharge space is kept constant.

FIGS. 9A and 9B are illustration diagrams schematically showing a basic configuration of a conventional active gas-generating device adopting a disk-shaped electrode structure. FIG. 9A is a view showing an outline viewed diagonally downward from the top, and FIG. 9B is a cross-sectional view showing a cross-sectional structure. FIG. 10 is an enlarged illustration diagram showing the gas jetting hole 9 and the vicinity thereof shown in FIGS. 9A and 9B. Note that in FIGS. 9A, 9B and 10, XYZ orthogonal coordinate systems are appropriately illustrated.

As shown in FIGS. 9A, 9B and 10, the active gas-generating device includes, as the basic configuration, a high-voltage side electrode constituent part 1X, and a ground side electrode constituent part 2X provided below the high-voltage side electrode constituent part 1X. The high-voltage side electrode constituent part 1X includes a dielectric electrode 11X and a metal electrode 10X that is provided on the upper surface of the dielectric electrode 11X and is formed into a donut shape in plan view having a space at the center. The ground side electrode constituent part 2X includes a dielectric electrode 21X and a metal electrode 20X that is provided on the bottom surface of the dielectric electrode 21X and is formed into a donut shape in plan view having a space at the center.

One gas-jetting hole 9 is provided at the center of the central part of the dielectric electrode 21X (a region where the metal electrodes 20X, 10X do not overlap with each other in plan view). Note that an AC voltage is applied to the high-voltage side electrode constituent part 1X and the ground side electrode constituent part 2X by a high frequency power supply, not shown.

By the application of the AC voltage from the high frequency power supply, a region where the metal electrodes 10X, 20X overlap with each other in plan view is defined as a discharge space DSX (discharge field) in a dielectric space where the dielectric electrodes 11X, 21X face each other.

In such a configuration, the discharge space DSX is formed between the high-voltage side electrode constituent part 1X and the ground side electrode constituent part 2X by the application of the AC voltage, and a source gas is supplied along a gas flow 8 in the discharge space DSX, to obtain an active gas such as radicalized nitrogen atoms, which allows the active gas to be jetted to a lower outside (in the −Z direction) from the gas-jetting hole 9 provided at the center of the dielectric electrode 21X.

Therefore, in the conventional active gas-generating device adopting the disk-shaped electrode structure, as shown in FIG. 10, the gas flow 8 in the discharge space can be made constant irrespective of the supply direction thereof.

FIGS. 11A and 11B are illustration diagrams schematically showing a basic configuration of a conventional active gas-generating device adopting a cylindrical electrode structure. FIG. 11A shows a side structure, and FIG. 11Bu shows a surface structure. Note that in FIGS. 11A and 11B, an XYZ orthogonal coordinate system is appropriately illustrated.

As shown in FIGS. 11A and 11B, the active gas-generating device includes, as the basic configuration, a high-voltage side electrode constituent part 1Y, and a ground side electrode constituent part 2Y provided inside the high-voltage side electrode constituent part 1Y.

The ground side electrode constituent part 2Y includes: a rod-like metal electrode 20Y having a circular cross-sectional structure on the XZ plane, and provided at the center of a circle on the XZ plane of the high-voltage side electrode constituent part 1Y; and a dielectric electrode 21Y formed so as to cover the outer periphery of the metal electrode 20Y. The high-voltage side electrode constituent part 1Y includes: a hollow cylindrical dielectric electrode 11Y having a space inside and having a circular cross-sectional structure; and a metal electrode 10Y formed to cover the outer periphery of the dielectric electrode 11Y.

A discharge space DSY is provided in a hollow region provided between the dielectric electrode 11Y and the dielectric electrode 21Y. In addition, an AC voltage is applied to the high-voltage side electrode constituent part 1Y and the ground side electrode constituent part 2Y by a high frequency power supply, not shown.

By the application of the AC voltage from the high frequency power supply, a space between the inner peripheral region of the metal electrode 10Y and the outer peripheral region of the metal electrode 20Y is defined as a discharge space DSY in a dielectric space where the dielectric electrodes 11Y, 21Y face each other.

In such a configuration, the discharge space DSY is formed between the high-voltage side electrode constituent part 1Y and the ground side electrode constituent part 2Y by the application of the AC voltage, and a source gas 6 having a gas flow 8 along the height direction (Y direction) of the cylinder in the discharge space DSY is supplied from one end part, to obtain an active gas 7 such as radicalized nitrogen atoms, which allows the active gas 7 to be jetted to a lower outside from the other end part.

Therefore, in the conventional active gas-generating device adopting the cylindrical electrode structure, as shown in FIGS. 11A and 11B, the gas flow 8 in the discharge space can be made constant irrespective of the supply direction thereof.

Note that an example of the active gas-generating device adopting the disk-shaped electrode structure shown in FIGS. 9A, 9B and 10 is a plasma treatment device disclosed in Patent Document 1. In addition, for example, Patent Document 2 discloses an atmospheric pressure plasma treatment device that generates an active gas by using atmospheric pressure plasma and to perform film formation or the like, as an active gas-generating device adopting a method different from the above-described method.

PRIOR ART DOCUMENTS

Patent Documents

Patent Document 1: Japanese Patent Application Laid-Open No. 2011-154973
Patent Document 2: Japanese Patent Application Laid-Open No. 2015-5780

SUMMARY

Problem to be Solved by the Invention

There will be considered a case where a substrate to be treated is disposed right below an active gas-generating device so that an active gas obtained by activating a source gas can be quickly supplied to a film formation target, and film formation treatment is executed by jetting the active gas in a relatively wide region. In this case, instead of providing one gas-jetting hole that branches off immediately before the substrate to be treated and supplying an active gas from the one gas-jetting hole, providing a plurality of gas-jetting holes in advance and supplying an active gas from the plurality of gas-jetting holes can make the active-gas transfer distance to the substrate to be treated shorter. In a case where an active gas is of a kind that is attenuated, it is expected that the active gas with a higher concentration is supplied to the substrate to be treated.

However, in the case of increasing the number of gas-jetting holes, since the conventional active gas-generating device adopting the cylindrical electrode structure has a basic structure of including one gas-jetting hole (space communicating with the discharge space DSY) (see FIGS. 11A and 11B), it is practically impossible to provide a plurality of gas-jetting holes.

In contrast, in the conventional active gas-generating device adopting the disk-shaped electrode structure, it is also possible to provide a plurality of gas-jetting holes.

FIG. 12 is an illustration diagram schematically showing a basic configuration of an active gas-generating device adopting a disk-shaped electrode structure having two gas-jetting holes, and specifically, is a diagram showing an outline viewed diagonally downward from the top. FIG. 13 is an enlarged illustration diagram showing the gas-jetting holes and the vicinity thereof shown in FIG. 12. Note that in FIGS. 12 and 13, XYZ orthogonal coordinate systems are appropriately illustrated.

As shown in FIG. 12, the active gas-generating device includes, as the basic configuration, a high-voltage side electrode constituent part 102, and a ground side electrode constituent part 202 provided below the high-voltage side electrode constituent part 102. The high-voltage side electrode constituent part 102 includes a dielectric electrode 13 and a metal electrode 12 that is provided on the upper surface of the dielectric electrode 13 and is formed into a donut shape in plan view having a space at the center. The ground side electrode constituent part 202 includes a dielectric electrode 23 and a metal electrode 22 that is provided on the bottom surface of the dielectric electrode 23 and is formed into a donut shape in plan view having a space at the center.

Two gas-jetting holes 91 and 92 are provided along the X direction at the central part (a region where the metal electrodes 22, 12 do not overlap with each other in plan view) of the dielectric electrode 23.

By application of an AC voltage from a high frequency power supply, a region where the metal electrodes 12, 22 overlap with each other in plan view is defined as a discharge space in a dielectric space where the dielectric electrodes 13, 23 face each other.

In such a configuration, the discharge space is formed between the high-voltage side electrode constituent part 102 and the ground side electrode constituent part 202 by the application of the AC voltage, and a source gas 6 is supplied along a gas flow 8 in the discharge space, to obtain an active gas such as radicalized nitrogen atoms, which allows the active gas to be jetted to a lower outside from the gas-jetting hole 91 or the gas-jetting hole 92 provided at the central part of the dielectric electrode 23.

Therefore, in the conventional active gas-generating device adopting the disk-shaped electrode structure, as shown in FIG. 13, also in the case of providing the two gas-jetting holes 91, 92, the gas flow 8 in the discharge space can be made constant irrespective of the supply direction thereof.

However, in a case where three or more gas-jetting holes are provided in one row, for example, in a case where three gas-jetting holes are provided, there is a problem that it is difficult to keep a gas flow 8 identical between the two gas-jetting holes at both ends and the one gas-jetting hole at the center.

Therefore, also in the technique disclosed in Patent Document 1, since three or more gas-jetting holes are provided in the disk-shaped electrode structure when radicals are generated by dielectric barrier discharge, it is highly likely that there are differences in the flowing gas flow rate, the amount of generated radicals, and concentration among the plurality of gas-jetting holes, and there is a problem that it is impossible to uniformly supply the active gas.

In addition, in the technique disclosed in Patent Document 2, since plasma is generated near the substrate to be treated, a substance reacts in the vicinity of the substrate to be treated to form a high-quality film; however, there is a problem that it is highly likely that the substrate to be treated is damaged by the plasma since the substrate to be treated is in an environment where the substrate to be treated is directly affected by the plasma.

It is an object of the present invention to solve the above problems and to provide an active gas-generating device capable of jetting a highly uniform active gas without damaging a substrate to be treated.

Means to Solve the Problem

An active gas-generating device according to the present invention is an active gas-generating device that generates an active gas obtained by activating a source gas supplied to a discharge space and includes: a first electrode constituent part; and a second electrode constituent part that is provided below the first electrode constituent part. An AC voltage is applied to the first electrode constituent part and the second electrode constituent part. By application of the AC voltage, the discharge space is formed between the first electrode constituent part and the second electrode constituent part. The first electrode constituent part includes a first dielectric electrode and a first metal electrode selectively formed on an upper surface of the first dielectric electrode. The second electrode constituent part includes a second dielectric electrode and a second metal electrode selectively formed on a bottom surface of the second dielectric electrode. By the application of the AC voltage, a region where the first metal electrode and the second metal electrode overlap each other in plan view is defined as the discharge space, in a dielectric space where the first dielectric electrode and the second dielectric electrode face each other. The second metal electrode includes a pair of second partial metal electrodes formed so as to face each other with a central region of the second dielectric electrode interposed therebetween in plan view. An electrode formation direction of the pair of second partial metal electrodes is a first direction and a direction in which the pair of second partial metal electrodes face each other is a second direction intersecting with the first direction. The first metal electrode includes a pair of first partial metal electrodes having a region overlapping with the pair of second partial metal electrodes in plan view. The second dielectric electrode includes a plurality of gas-jetting holes formed in the central region and jetting the active gas to an outside, and a pair of end region step parts formed along the second direction so as to protrude upward and provided at both end sides in the first direction with all the plurality of gas-jetting holes interposed therebetween. The pair of end region step parts are formed so as to extend in the second direction beyond at least positions where the pair of second partial metal electrodes are formed in plan view. The plurality of gas-jetting holes includes: a first number of first jetting holes, the first number being at least three, and the first number of the first jetting holes being formed at every first interval along the first direction; and a second number of second jetting holes, the second number being at least three, and the second number of the second jetting holes being disposed at a predetermined interval in the second direction from the first number of the first jetting holes, and being formed at every second interval along the first direction. The first number of the first jetting holes and the second number of the second jetting holes are formed such that the first jetting holes and the second jetting holes are alternately disposed along the first direction.

Effects of the Invention

Since the active gas-generating device of the present invention has the features described above, the distance between the first jetting hole and the second jetting hole that are closest to each other along the first direction is a substantial active-gas jetting pitch along the first direction. As a result, it is possible to jet highly uniform active gases by jetting a plurality of active gases from the plurality of jetting holes having an active-gas jetting pitch shorter than each of the first interval and the second interval.

In addition, since the active gas itself is generated in the discharge space between the first and second electrode constituent parts, the substrate to be treated is not damaged upon active gas generation.

Further, in the present invention, existence of the pair of end region step parts restricts inflow of the source gas from the both end parts in the first direction of the second dielectric electrode into the discharge space. Therefore, it is possible to set source gas supply paths under an identical condition among the plurality of gas-jetting holes, and it is possible to jet highly uniform active gases.

The objects, features, aspects, and advantages of the present invention will become more apparent from the following detailed description and the accompanying drawings.

BRIEF DESCRIPTION OF DRAWINGS

FIG. 1 is an illustration diagram schematically showing a basic configuration of an active gas-generating device according to an embodiment 1 of the present invention.

FIG. 4 is a perspective view schematically showing the appearance configuration of an electrode-group constituent part including the high-voltage side electrode constituent part and the ground side electrode constituent part according to the embodiment 1.

FIG. 8 is an illustration diagram schematically showing a connection relationship among a high-voltage side electrode constituent part, a ground side electrode constituent part, and a high frequency power supply according to a first aspect.

FIGS. 9A and 9B are illustration diagrams schematically showing a basic configuration of a conventional active gas-generating device adopting a disk-shaped electrode structure.

FIG. 12 is an illustration diagram schematically showing a basic configuration of a conventional active gas-generating device adopting a disk-shaped electrode structure having two gas-jetting holes.

FIG. 13 is an enlarged illustration diagram showing the gas-jetting holes and the vicinity thereof shown in FIG. 12.

DESCRIPTION OF EMBODIMENTS

<Underlying Technique>

Figure 14:
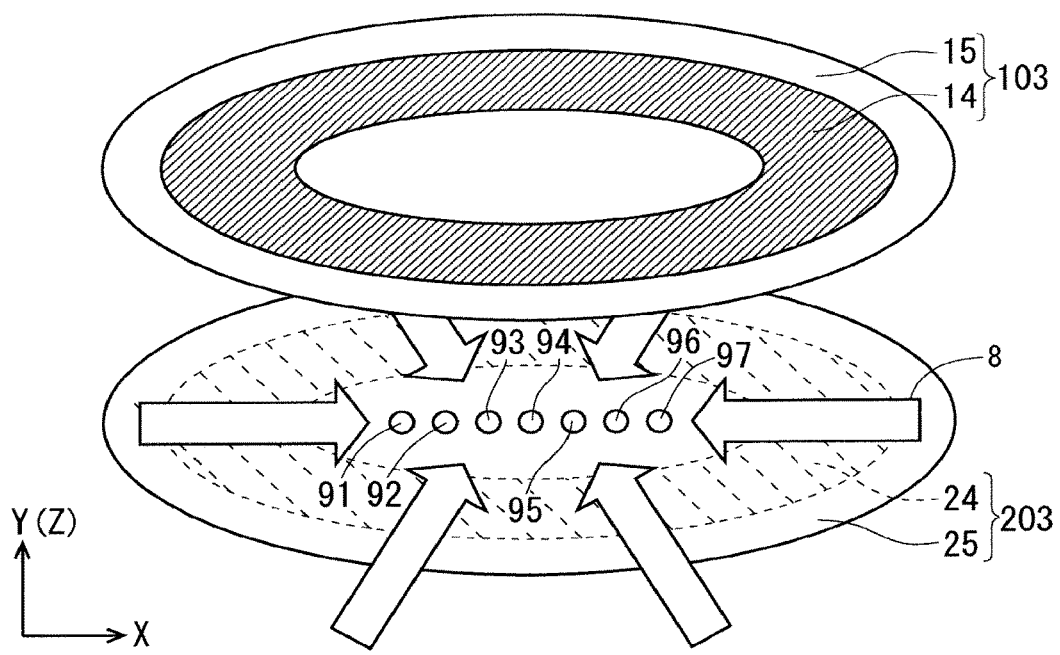
FIG. 14 is an illustration diagram schematically showing a basic configuration of a conventional active gas-generating device adopting a disk-shaped electrode structure having three or more gas-jetting holes.
Figure 15:
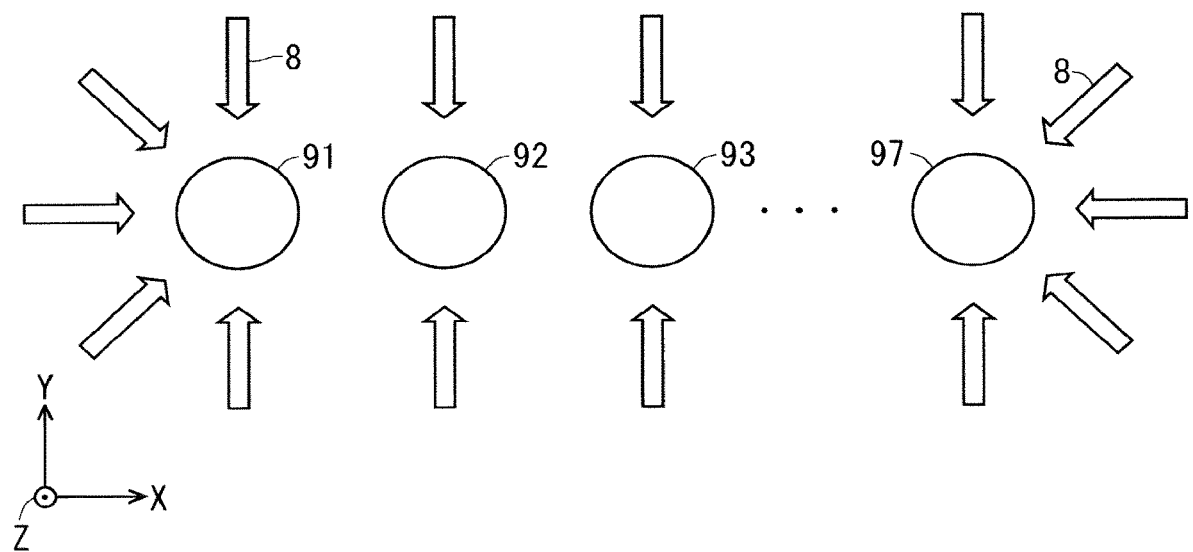
FIG. 15 is an enlarged illustration diagram showing the plurality of gas-jetting holes and the vicinity thereof shown in FIG. 14.

FIG. 14 is an illustration diagram schematically showing a basic configuration of an active gas-generating device that shows an underlying technique adopting a disk-shaped electrode structure having three or more gas-jetting holes. FIG. 14 shows a diagram showing an outline viewed diagonally downward from the top. In addition, FIG. 15 is an enlarged illustration diagram showing the plurality of gas-jetting holes and the vicinity thereof shown in FIG. 14. Note that in FIGS. 14 and 15, XYZ orthogonal coordinate systems are appropriately illustrated.

As shown in FIGS. 14 and 15, the active gas-generating device includes, as the basic configuration, a high-voltage side electrode constituent part 103, and a ground side electrode constituent part 203 provided below the high-voltage side electrode constituent part 103. The high-voltage side electrode constituent part 103 includes a dielectric electrode 15, and a metal electrode 14 that is provided on the upper surface of the dielectric electrode 15 and has a space provided at the center and having a circular shape or an elliptical shape whose major axis direction is the X direction. The ground side electrode constituent part 203 includes a dielectric electrode 25, and a metal electrode 24 that is provided on the bottom surface of the dielectric electrode 25 and has a circular space at the center or an elliptical space that is provided at the center and whose major axis direction is the X direction.

Seven gas-jetting holes 91 to 97 are provided in a line along the X direction at the central part (a region where the metal electrodes 24 and 14 do not overlap with each other in plan view) of the dielectric electrode 25.

By application of an AC voltage from a high frequency power supply, a region where the metal electrodes 14, 24 overlap with each other in plan view is defined as a discharge space, in a dielectric space where the dielectric electrodes 15, 25 face each other.

In such a configuration, the discharge space is formed between the high-voltage side electrode constituent part 103 and the ground side electrode constituent part 203 by the application of the AC voltage, and a source gas 6 is supplied along gas flows 8 in the discharge space, to obtain an active gas such as radicalized nitrogen atoms, which allows the active gas to be jetted to a lower outside (in the −Z direction) from the gas-jetting holes 91 to 97 provided at the central part of the dielectric electrode 25.

However, as shown in FIG. 15, in the active gas-generating device having the structure shown in FIG. 14, among the gas-jetting holes 91 to 97, it is highly likely that there is unevenness in the gas flow rate and the energy received by the gas between the gas-jetting holes 91, 97 (hereinafter may be abbreviated as "both-ends gas-jetting holes") at both ends and the gas-jetting holes 92 to 96 (hereinafter may be abbreviated as "central gas-jetting holes" provided between the gas-jetting holes 91, 97.

Specifically, to the gas-jetting holes 91 and 97, the gas flows 8 in the X direction exist in addition to the gas flows 8 in the Y direction; however, to the gas-jetting holes 92 to 96, only the gas flows 8 from the Y direction exist.

As described above, in the case of adopting a disk-shaped (elliptical) electrode structure, when the number of gas-jetting holes is three or more, there is a problem that it becomes difficult to make the gas flows constant between the both-ends gas-jetting holes and the central gas-jetting holes.

In order to solve the above problem, it is conceivable to adopt a rectangular electrode structure instead of a circular planar structure such as a disk.

Figure 16:
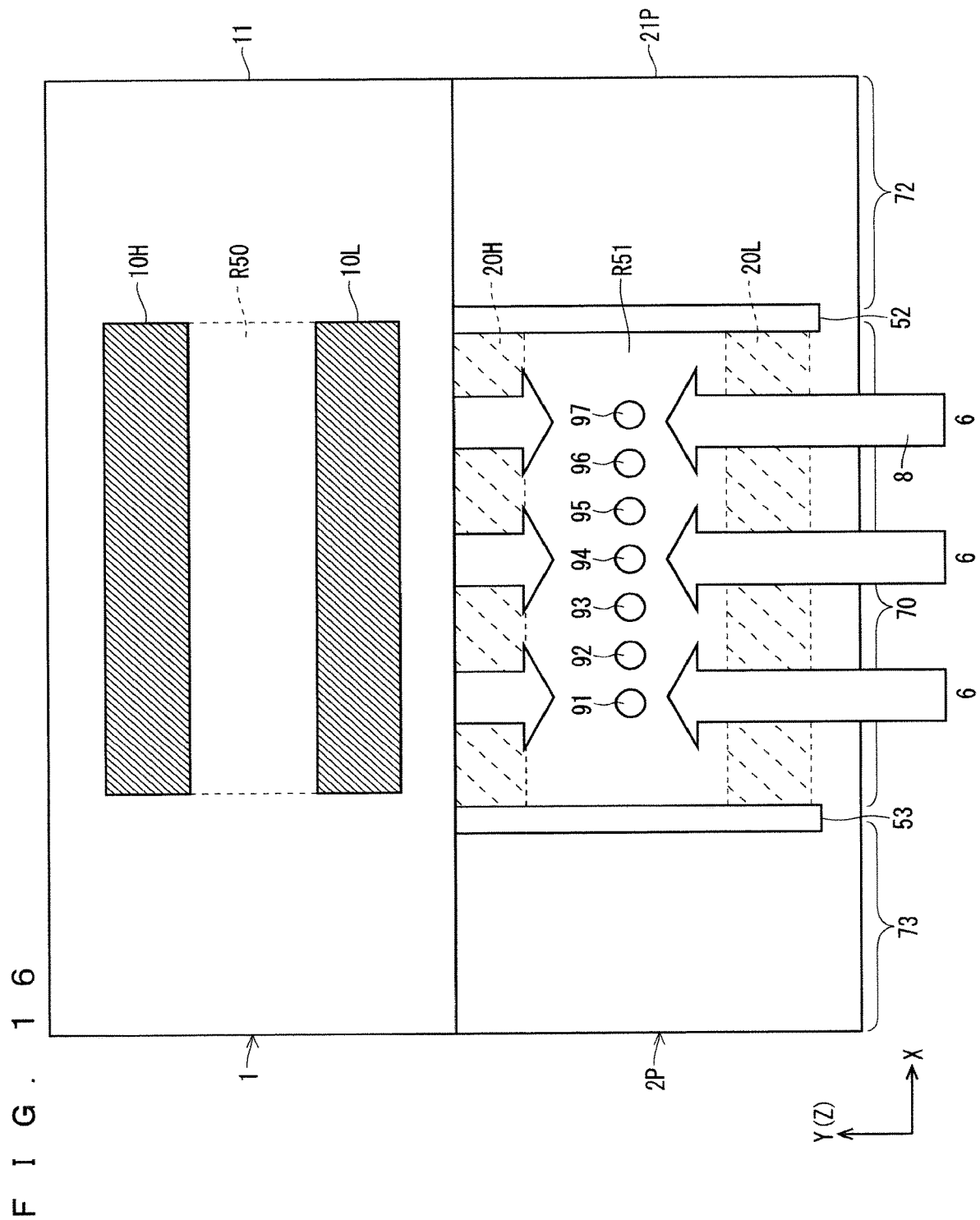
FIG. 16 is an illustration diagram schematically showing a basic configuration of a conventional active gas-generating device adopting a rectangular electrode structure having three or more gas-jetting holes.
Figure 17:
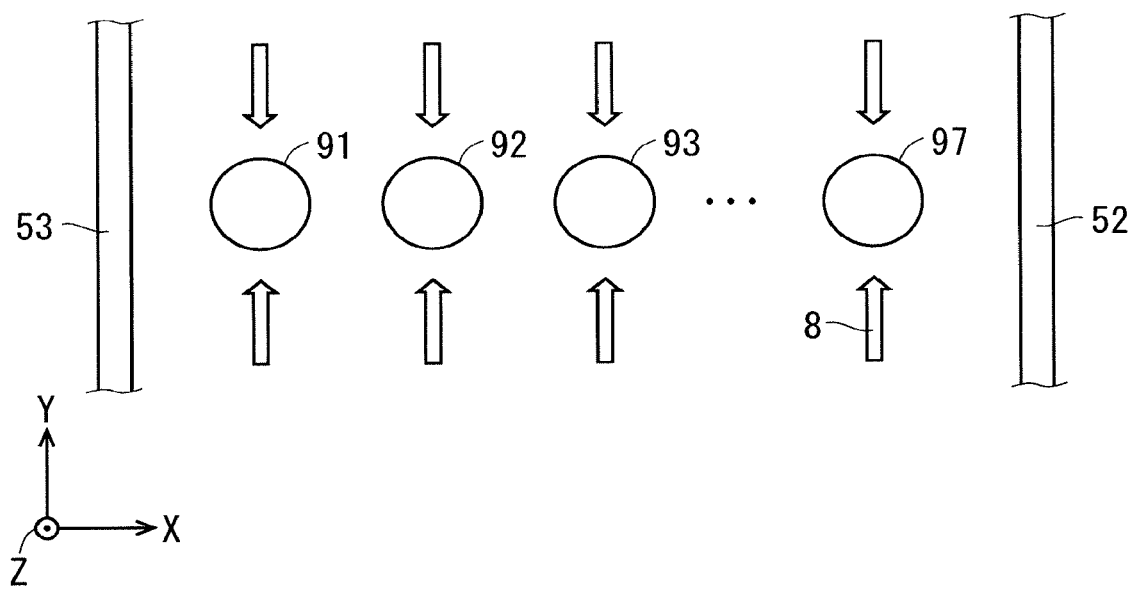
FIG. 17 is an enlarged illustration diagram showing the plurality of gas-jetting holes and the vicinity thereof shown in FIG. 16.

FIG. 16 is an illustration diagram schematically showing a basic configuration of an active gas-generating device adopting a rectangular electrode structure having three or more gas-jetting holes. FIG. 16 shows a diagram showing an outline viewed diagonally downward from the top. In addition, FIG. 17 is an enlarged illustration diagram showing the plurality of gas-jetting holes and the vicinity thereof shown in FIG. 16. Note that in FIGS. 16 and 17, XYZ orthogonal coordinate systems are appropriately illustrated.

As shown in FIGS. 16 and 17, the active gas-generating device includes, as the basic configuration, a high-voltage side electrode constituent part 1 (first electrode constituent part), and a ground side electrode constituent part 2P (second electrode constituent part) provided below the high-voltage side electrode constituent part 1.

The high-voltage side electrode constituent part 1 includes a dielectric electrode 11 (first dielectric electrode), a pair of metal electrodes 10H, 10L (a pair of first partial metal electrodes) that are separately provided on the upper surface of the dielectric electrode 11. The ground side electrode constituent part 2P includes a dielectric electrode 21P and a pair of metal electrodes 20H, 20L (a pair of second partial metal electrodes) that are separately provided on the bottom surface of the dielectric electrode 21P.

Each of the dielectric electrodes 11 and 21P has a rectangular flat plate structure with an X direction as a longitudinal direction and a Y direction as a short direction. Hereinafter, in the dielectric electrode 21P, with stepped parts 52, 53 for flow straightening to be described later as boundaries, a central part may be referred to as a main region 70 and both end parts may be referred to as end regions 72, 73.

With respect to the dielectric electrode 21P (second dielectric electrode), for example, seven gas-jetting holes 91 to 97 (three or more gas-jetting holes) are provided along the X direction (first direction) in a central region R51 in the main region 70. Each of the plurality of gas-jetting holes 91 to 97 is provided so as to pass through the dielectric electrode 21P from the upper surface to the bottom surface.

As shown in FIGS. 16 and 17, the pair of metal electrodes 20H, 20L (pair of second partial metal electrodes) are formed on the bottom surface of the dielectric electrode 21P, and disposed so as to face each other with the central region R51 of the dielectric electrode 21P interposed therebetween in plan view. Each of the pair of metal electrodes 20H, 20L has a substantially rectangular shape in plan view. The longitudinal direction (electrode formation direction) of the metal electrodes 20H, 20L is the X direction (first direction), and the direction in which the metal electrodes 20H, 20L face each other is the Y direction (second direction) intersecting at a right angle with the X direction. The pair of metal electrodes 20H, 20L are equal to each other in size in plan view, and are symmetrically disposed with the central region R51 as the center.

Similarly, the pair of metal electrodes 10H, 10L (pair of first partial metal electrodes) are formed on the upper surface of the dielectric electrode 11, and disposed so as to face each other with the central region R50 of the dielectric electrode 11 interposed therebetween in plan view. Each of the pair of metal electrodes 10H, 10L has a substantially rectangular shape in plan view. The longitudinal direction of the metal electrodes 10H, 10L is the X direction, and the direction in which the metal electrodes 10H, 10L face each other is the Y direction intersecting at the right angle with the X direction. The pair of metal electrodes 10H, 10L are equal to each other in size in plan view, and are symmetrically disposed with the central region R50 as the center. The central region R50 and the central region R51 have completely identical shapes and are provided so as to completely overlap with each other in plan view.

Note that the pair of metal electrodes 10H, 10L and the pair of metal electrodes 20H, 20L are formed by a metallization treatment on the upper surface of the dielectric electrode 11 and the bottom surface of the dielectric electrode 21P, respectively. As a result, the dielectric electrode 11, the pair of metal electrodes 10H, 10L are integrally formed to constitute the high-voltage side electrode constituent part 1 (first electrode constituent part), and the dielectric electrode 21P, the pair of metal electrodes 20H, 20L are integrally formed to constitute the ground side electrode constituent part 2P (second electrode constituent part). Examples of the metallization treatment include treatments using a printing firing method, a sputtering treatment, and a vapor deposition treatment and the like.

Seven gas-jetting holes 91 to 97 are provided in a line along the X direction at the central region R51 (region where the metal electrodes 10H, 10L do not overlap with the pair of metal electrodes 20H, 20L in plan view) of the dielectric electrode 21P.

By application of an AC voltage from a high frequency power supply, not shown, regions where the pair of metal electrodes 10H, 10L overlap with the pair of metal electrodes 20H, 20L in plan view are defined as discharge spaces (discharge fields) in a dielectric space where the dielectric electrodes 11, 21P face each other.

In such a configuration, the discharge spaces are formed between the high-voltage side electrode constituent part 1 and the ground side electrode constituent part 2P by the application of the AC voltage, and a source gas is supplied along gas flows 8 in the discharge spaces, to obtain active gas such as radicalized nitrogen atoms, which allows the active gas to be jetted to a lower outside from the gas-jetting holes 91 to 97 provided at the central part of the dielectric electrode 21P.

As shown in FIG. 17, in the active gas-generating device having the rectangular electrode structure shown in FIGS. 16 and 17, with respect to the gas flows 8 along the Y direction received by the gas-jetting holes 91 to 97, it is possible to lower the likelihood that there is unevenness in the gas flow rate and the energy received by the gas among the gas-jetting holes 91 to 97.

In the active gas-generating device according to the underlying technique, the gas-jetting holes 91 to 97 are provided in one row along the X direction in the central region R51 of the dielectric electrode 21P.

It is desirable that each of the gas-jetting holes 91 to 97 also function as an orifice that generates a pressure difference between the discharge space (discharge field) formed upstream thereof and a treatment chamber casing or the like located downstream thereof. Therefore, the total hole area of the gas-jetting holes 91 to 97 is determined in advance and cannot be changed. In the case of providing a plurality of gas-jetting holes, it is necessary to provide the plurality of gas-jetting holes with a hole size and the number of holes according to the minimum processing hole diameter taking into consideration the minimum processing limit to ceramics that is a constituent material of the dielectric electrode 21P.

In a case where the gas-jetting holes 91 to 97 each having the minimum processing hole diameter are provided, when the minimum processing limit or the like to the dielectric electrode 21P is taken into consideration, a hole pitch, which is the distance between adjacent gas-jetting holes $9i$, $9 (i+1)$ (i=1 to 6) becomes inevitably large. The active gas-generating device according to the underlying technique has the problem that also in a case where three or more gas-jetting holes are provided, the active gas-generating device is not suitable for a uniform treatment of uniformly jetting an active gas generated by a discharge phenomenon to a substrate to be treated such as a wafer when the hole pitch becomes large.

Embodiments to be described below are active gas-generating devices that aim at solving the problem of the above active gas-generating device according to the underlying technique.

Embodiment 1

Figure 2:
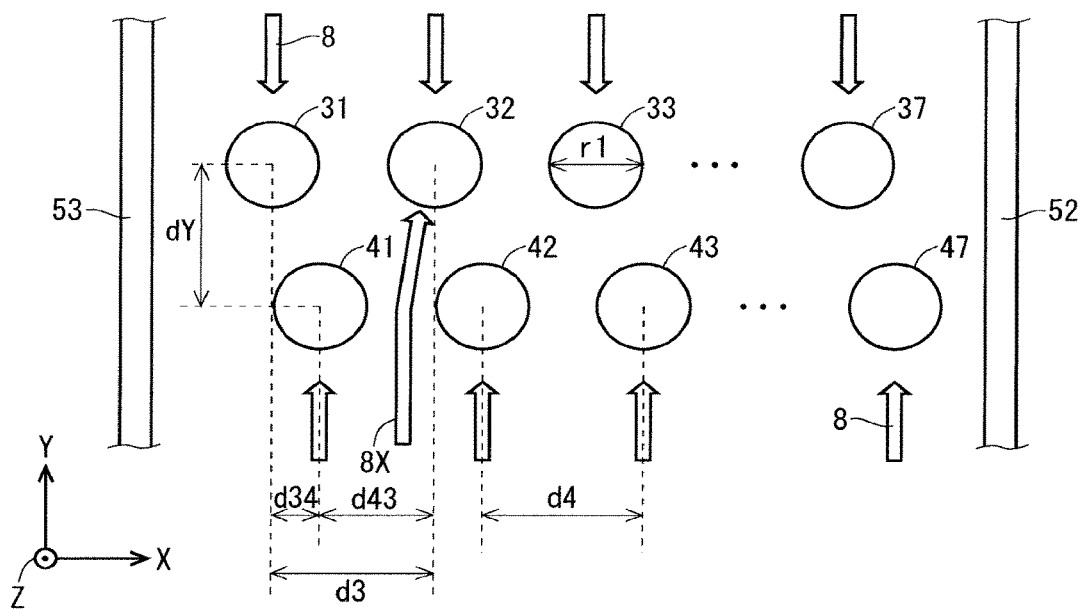
FIG. 2 is an enlarged illustration diagram showing a plurality of gas-jetting holes and the vicinity thereof shown in FIG. 1.

FIG. 1 is an illustration diagram schematically showing a basic configuration of an active gas-generating device according to an embodiment 1 of the present invention. FIG. 1 shows a diagram showing an outline viewed diagonally downward from the top. In addition, FIG. 2 is an enlarged illustration diagram showing a plurality of gas-jetting holes and the vicinity thereof shown in FIG. 1. Note that in FIGS. 1 and 2, XYZ orthogonal coordinate systems are appropriately illustrated.

Note that the structures and arrangement of a dielectric electrode 11, a pair of metal electrodes 10H, 10L, and a pair of metal electrodes 20H, 20L, and the shapes, arrangement, and the like of central regions R50, R51 are identical to those according to the underlying technique shown in FIGS. 16 and 17, and therefore identical signs are given and explanation thereof will be omitted as appropriate.

As shown in FIGS. 1 and 2, the active gas-generating device includes, as the basic configuration, a high-voltage side electrode constituent part 1 (first electrode constituent part), and a ground side electrode constituent part 2 (second electrode constituent part) provided below the high-voltage side electrode constituent part 1.

The high-voltage side electrode constituent part 1 includes the dielectric electrode 11 (first dielectric electrode), and the pair of metal electrodes 10H, 10L (pair of first partial metal electrodes) that are separately provided on the upper surface of the dielectric electrode 11. The ground side electrode constituent part 2 includes a dielectric electrode 21 (second dielectric electrode), and a pair of metal electrodes 20H, 20L (pair of second partial metal electrodes) that are separately provided on the bottom surface of the dielectric electrode 21.

Each of the dielectric electrodes 11, 21 has a flat plate structure having a rectangular shape in plan view with an X direction as a longitudinal direction and a Y direction as a short direction.

With respect to the dielectric electrode 21 (second dielectric electrode), gas-jetting holes 31 to 37 and gas-jetting holes 41 to 47 are provided as three or more gas-jetting holes, along the X direction (first direction) in the central region R51 in a main region 70. Each of the gas-jetting holes 31 to 37 and 41 to 47 is formed in a circular shape in which the diameter of an opening cross-sectional shape in plan view is r1.

The seven gas-jetting holes 31 to 37 (a first number of first gas-jetting holes) are formed in a line along the X direction, and a first hole pitch d3 (first interval) is commonly set between the adjacent gas-jetting holes 3$i$, 3 (i+1) (i=1 to 6) from among the gas-jetting holes 31 to 37. Similarly, the seven gas-jetting holes 41 to 47 (a second number of second gas-jetting holes) are formed in a line along the X direction, and a second hole pitch d4 (second interval) is commonly set between the adjacent gas-jetting holes 4$i$, 4 (i+1) (i=1 to 6) from among the gas-jetting holes 41 to 47. Note that it is desirable that the second hole pitch d4 and the first hole pitch d3 be set to an identical length.

In addition, the gas-jetting holes 31 to 37 and the gas-jetting holes 41 to 47 are provided in two rows with an interval dY (predetermined interval) in the Y direction therebetween.

By providing a difference hole pitch d34 in the X direction between the position where the gas-jetting hole 31 is formed and the position where the gas-jetting hole 41 is formed, the positions of the gas-jetting holes 31 to 37 and the gas-jetting holes 41 to 47 disposed in two rows are set such that the gas jetting holes 3$i$ and the gas-jetting holes 4$i$ (i=1 to 7) are alternately disposed along the X direction (first direction).

That is, the difference hole pitch d34, which is the interval in the X direction between the gas-jetting hole 3$i$ and the gas-jetting hole 4$i$ (i=1 to 7) is shorter than each of the first hole pitch d3 and the second hole pitch d4, and a difference hole pitch d43, which is the interval in the X direction between the gas-jetting hole 4$i$ and the gas-jetting hole 3 (i+1) (i=1 to 6) is shorter than each of the first hole pitch d3 and the second hole pitch d4.

As described above, since the active gas-generating device according to the embodiment 1 has the above-described features, the difference hole pitch d34 or the difference hole pitch d43, which is the distance between the gas-jetting holes 3$i$ (or the gas-jetting holes 3 (i+1)) and the gas-jetting holes 4$i$ positioned closest to each other along the X direction (the first direction) is a substantial active-gas jetting pitch from the gas-jetting holes 31 to 37 and 41 to 47 in two rows.

For example, in a case where the first hole pitch d3, the second hole pitch d4, the difference hole pitch d34, and the difference hole pitch d43 satisfy the dimensional condition {d34=d43=d3/2=d4/2}, the substantial hole pitch in the X direction of all the gas-jetting holes 31 to 37 and 41 to 47 defined by the difference hole pitch d34 and the difference hole pitch d43 can be set to the difference hole pitch d34 (=the difference hole pitch d43), and therefore, the substantial hole pitch can be shortened to the half of the first hole pitch d3 and the second hole pitch d4.

As a result, the active gas-generating device according to the embodiment 1 can jet highly uniform active gas by jetting the active gas from the gas-jetting holes 31 to 37 and 41 to 47 having a substantial hole pitch (the difference hole pitch d34 or the difference hole pitch d43) shorter than each of the first hole pitch d3 and the second hole pitch d4 (first and second intervals).

As shown in FIGS. 1 and 2, the dielectric electrode 21 further includes stepped parts 52, 53 for flow straightening (a pair of end region step parts) formed along the Y direction (second direction) so as to protrude upward (+Z direction) in boundary regions between the main region 70 and end part regions 72, 73, that is, in the regions near the end parts of the pair of metal electrodes 20H, 20L, such that all of the gas-jetting holes 31 to 37 and 41 to 47 are interposed between the stepped parts 52, 53 for flow straightening. Each of the stepped parts 52, 53 for flow straightening is formed so as to extend in the Y direction (+Y direction and −Y direction) beyond at least positions where the pair of metal electrodes 20H, 20L in plan view. Note that the stepped parts 52, 53 for flow straightening may extend in the Y direction over the entire length of the dielectric electrode 21 in the short direction or may define a gap length in the discharge space.

Existence of the stepped parts 52, 53 for flow straightening restricts inflow of the source gas 6 from the both end parts in the X direction of the dielectric electrode 21 to the discharge space. When gas inflow from the both end parts in the X direction of the dielectric electrode 21 is made possible, the amount of active gas flowing into the gas-jetting holes 31, 37 and the gas-jetting holes 41, 47 near the both end parts of the dielectric electrode 21 is likely to be affected. This problem is solved by providing the stepped parts 52, 53 for flow straightening.

By providing the stepped parts 52, 53 for flow straightening on the dielectric electrode 21, as shown in FIGS. 1 and 2, gas flows 8 between the high-voltage side electrode constituent part 1 and the ground side electrode constituent part 2 are reliably provided only from two surfaces in the Y direction. That is, as shown in FIG. 2, the source gas 6 is supplied only in the gas flows 8 mainly in the +Y direction to the gas-jetting holes 31 to 37, and the source gas 6 is supplied only in the gas flows 8 mainly in the −Y direction to the gas-jetting holes 41 to 47. Therefore, since the gas flows are relatively stabilized, pressure distribution in the discharge space becomes uniform and a uniform discharge space can be formed.

As described above, since the dielectric electrode 21 further includes the stepped parts 52, 53 for flow straightening, even in the gas-jetting holes 31, 37 and the gas-jetting holes 41, 47 close to the both end parts in the X direction among the gas-jetting holes 31 to 37 and the gas-jetting holes 41 to 47, the influence of unintended inflow of gas or the like from the both end parts does not cause a phenomenon in which the inflow amount of the active gas changes. Therefore, it is possible to jet the active gas without causing variations among the gas-jetting holes 31 to 37 and 41 to 47. As a result, the pressure distribution is uniform, and the flow rates in the gas-jetting holes 31 to 37 and 41 to 47 are equal to one another, which exhibits the effect of providing generated radical density relatively equal to each other in the active gas having passed through the discharge space.

That is, in the active gas-generating device according to the embodiment 1, existence of the stepped parts 52, 53 for flow straightening (the pair of end region step parts) restricts inflow of the source gas 6 from the both end parts in the X direction (first direction) of the dielectric electrode 21 (second dielectric electrode) to the discharge space. Therefore, it is possible to set supply paths of the source gas 6 under an identical condition among the gas-jetting holes 31 to 37 and 41 to 47 (the plurality of gas-jetting holes), and it is possible to jet the highly uniform active gas.

Figure 3:
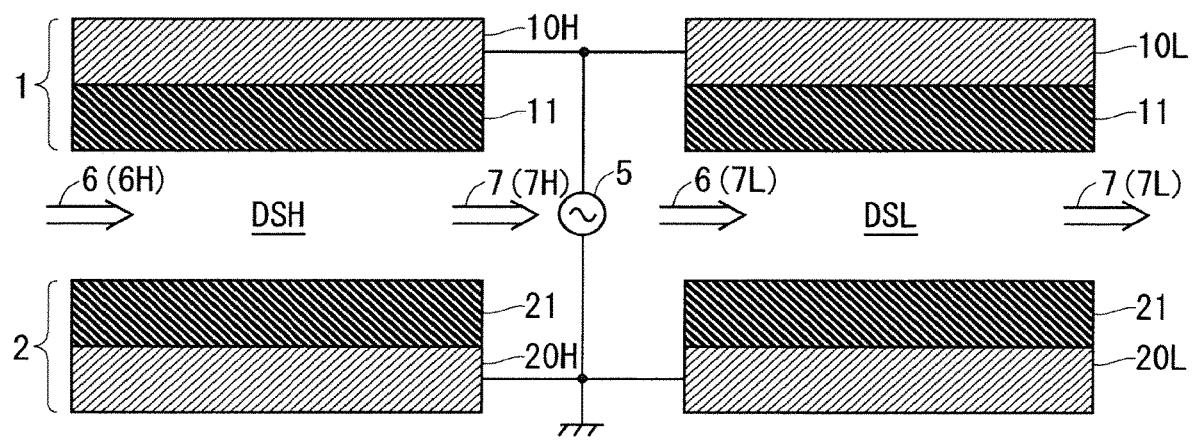
FIG. 3 is an illustration diagram schematically showing a connection relationship among a high-voltage side electrode constituent part, a ground side electrode constituent part, and a high frequency power supply according to the embodiment 1.

FIG. 3 is an illustration diagram schematically showing a connection relationship among the high-voltage side electrode constituent part 1, the ground side electrode constituent part 2, and a high frequency power supply 5. As shown in FIG. 3, the pair of the metal electrodes 20H, 20L of the ground side electrode constituent part 2 are connected to the ground level, and both the pair of metal electrodes 10H, 10L of the high-voltage side electrode constituent part 1 receive an AC voltage from the high frequency power supply 5.

For example, it is possible to fix a 0 peak value at 2 to 10 kV from the high frequency power supply 5, and to apply an AC voltage set at a frequency of 10 kHz to 100 kHz between the metal electrodes 10H, 10L and the metal electrodes 20H, 20L. At this time, 0 peak value or frequency can be set different between the high frequency power supplies 5H, 5L (see FIG. 8).

By the application of the AC voltage from the high frequency power supply 5, regions where the pair of metal electrodes 10H, 10L overlap with the pair of metal electrodes 20H, 20L in plan view are defined as discharge spaces in a dielectric space where the dielectric electrodes 11, 21 face each other.

Therefore, the source gas 6 passing through a discharge space DSH between the metal electrode 10H (one-side first partial metal electrode) and the metal electrode 20H (one-side second partial metal electrode) is activated in the discharge space DSH, and is jetted as an active gas 7 mainly from the gas-jetting holes 31 to 37. Similarly, the source gas 6 passing through a discharge space DSL between the metal electrode 10L (other-side first partial metal electrode) and the metal electrode 20L (other-side second partial metal electrode) is activated in the discharge space DSL, and is jetted as the active gas 7 mainly from the gas-jetting holes 41 to 47.

FIG. 4 is a perspective view schematically showing the appearance configuration of an electrode-group constituent part 101 including the high-voltage side electrode constituent part 1 and the ground side electrode constituent part 2 according to the embodiment 1.

As shown in the FIG. 4, the source gas 6 supplied along a gas supply direction D1H (−Y direction) along the Y direction passes through the discharge space DSH (see FIG. 3) between the metal electrode 10H and the metal electrode 20H, and is jetted in the −Z direction as the active gas 7 mainly from the gas-jetting holes 31 to 37. Similarly, the source gas 6 supplied along a gas supply direction D1L (+Y direction) along the Y direction passes through the discharge space DSL (see FIG. 3) between the metal electrode 10L and the metal electrode 20L, is activated in the discharge space DSL and is jetted in the −Z direction as the active gas 7 mainly from the gas-jetting holes 41 to 47. Therefore, the gas supply direction D1H is the −Y direction, the gas supply direction D1L is the +Y direction, and a gas jetting direction D2 is the −Z direction.

Therefore, by disposing a wafer 64, which is a substrate to be treated, immediately below the gas-jetting holes 31 to 37 and 41 to 47, in a treatment space SP63 inside a film formation treatment chamber 63 to be described later, it is possible to uniformly supply the active gas 7 to the wafer 64.

In addition, since the active gas 7 itself is generated in the discharge space between the high-voltage side electrode constituent part 1 and the ground side electrode constituent part 2, the wafer 64, which is the substrate to be treated, is not damaged upon generation of the active gas 7.

In the electrode-group constituent part 101 according to the embodiment 1, the high-voltage side electrode constituent part 1 is disposed on the ground side electrode constituent part 2. Thus, the electrode-group constituent part 101 can be assembled. Specifically, while the central region R50 of the dielectric electrode 11 in the high-voltage side electrode constituent part 1 and the central region R51 of the dielectric electrode 21 in the ground side electrode constituent part 2 are positioned so as to completely overlap with each other in plan view, the high-voltage side electrode constituent part 1 is stacked on the ground side electrode constituent part 2 for assembling, so that the electrode-group constituent part 101 can be completed.

Embodiment 2

Figure 5:
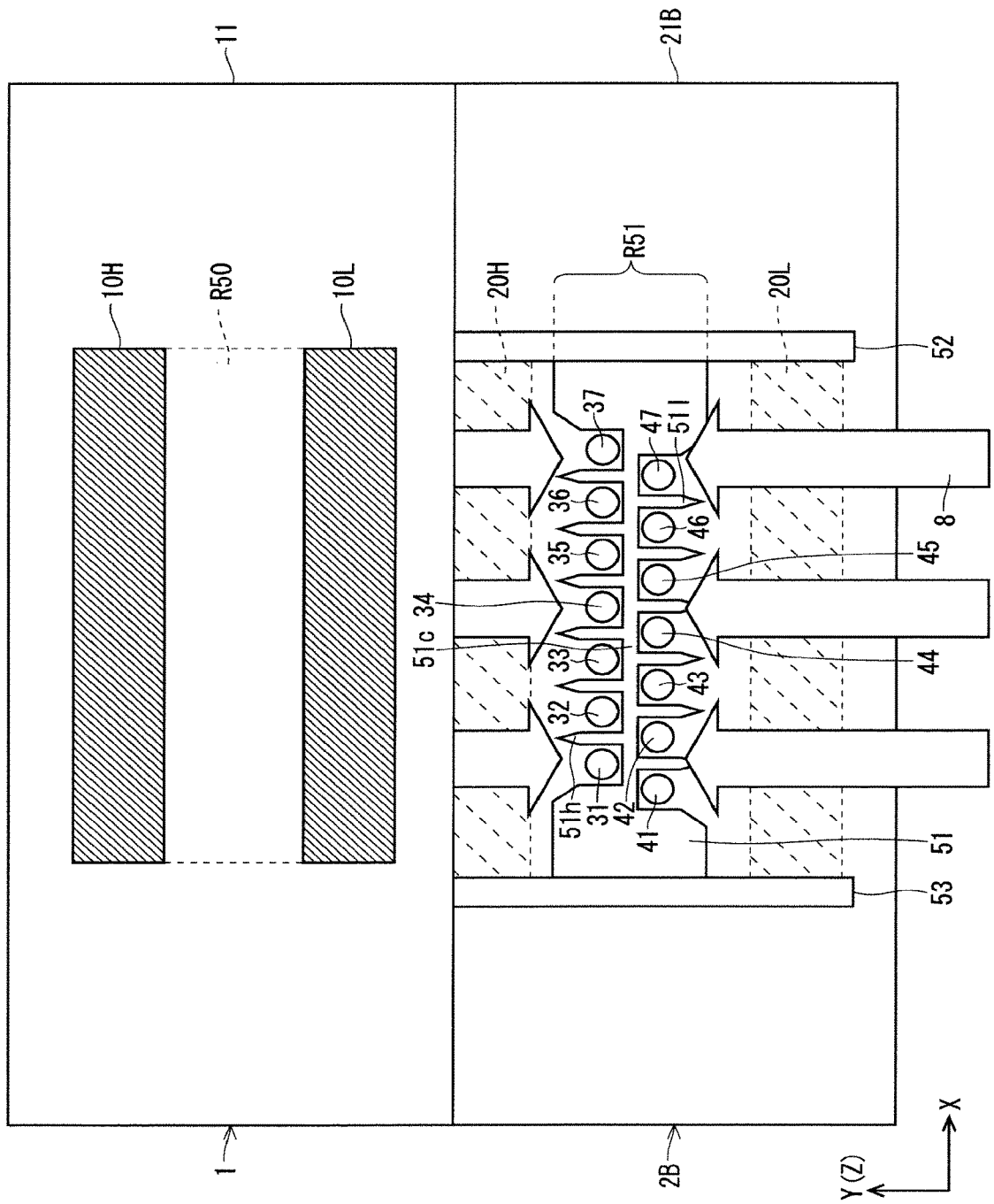
FIG. 5 is an illustration diagram schematically showing a basic configuration of an active gas-generating device according to an embodiment 2 of the present invention.
Figure 6:
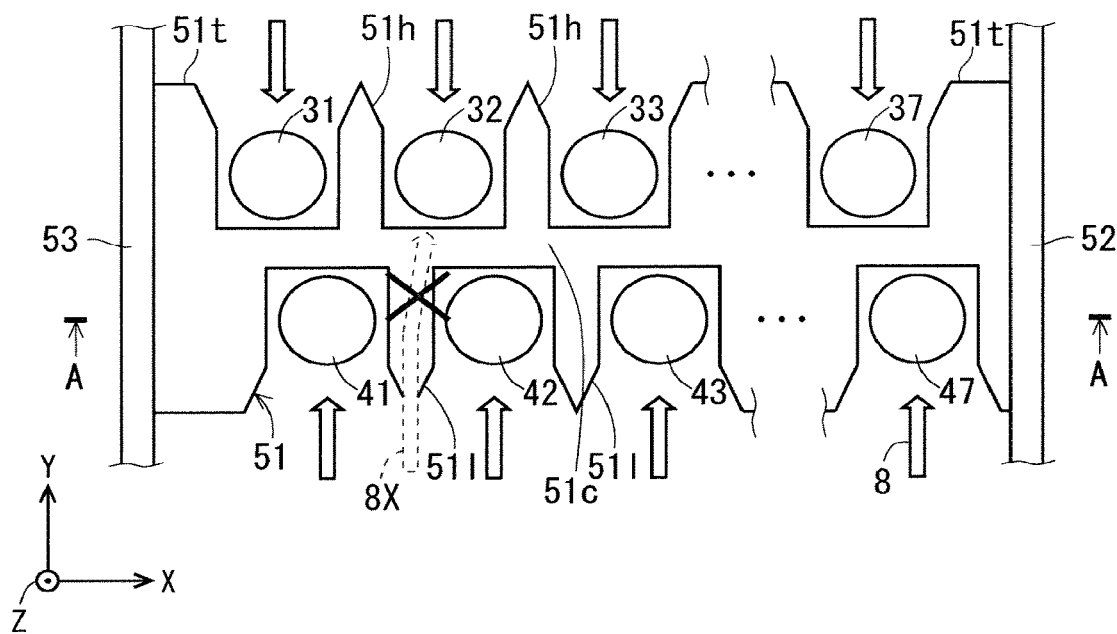
FIG. 6 is an enlarged illustration diagram showing a plurality of gas-jetting holes and the vicinity thereof shown in FIG. 5.

FIG. 5 is an illustration diagram schematically showing a basic configuration of an active gas-generating device according to an embodiment 2 of the present invention. FIG. 5 shows a diagram showing an outline viewed diagonally downward from the top. In addition, FIG. 6 is an enlarged illustration diagram showing a plurality of gas-jetting holes and the vicinity thereof shown in FIG. 5. Note that in FIGS. 5 and 6, XYZ orthogonal coordinate systems are appropriately illustrated.

As shown in FIGS. 5 and 6, the active gas-generating device includes, as the basic configuration, a high-voltage side electrode constituent part 1 (first electrode constituent part), and a ground side electrode constituent part 2B (second electrode constituent part) provided below the high-voltage side electrode constituent part 1. Note that since the high-voltage side electrode constituent part 1 is identical to that in the embodiment 1 shown in FIGS. 1 to 4 and that according to the underlying technique shown in FIGS. 16 and 17, identical signs are given and explanation thereof will be omitted as appropriate.

The ground side electrode constituent part 2B includes a dielectric electrode 21B and a pair of metal electrodes 20H, 20L (a pair of second partial metal electrodes) that are separately provided on the bottom surface of the dielectric electrode 21B.

Therefore, each of the dielectric electrodes 11, 21B has a rectangular flat plate structure with an X direction as a longitudinal direction and a Y direction as a short direction.

With respect to the dielectric electrode 21B (second dielectric electrode), similarly to the dielectric electrode 21 according to the embodiment 1, gas-jetting holes 31 to 37 and gas-jetting holes 41 to 47 are provided as three or more gas-jetting holes, along the X direction (first direction) in a central region R51 in a main region 70. That is, also in the gas-jetting holes 31 to 37 and the gas-jetting holes 41 to 47 of the embodiment 2, a first hole pitch d3, a second hole pitch d4, a difference hole pitch d34, a difference hole pitch d43, and an interval dY similarly to those in the embodiment 1 are set.

Therefore, similarly to the embodiment 1, the active gas-generating device according to the embodiment 2 is characterized in that the gas-jetting holes 31 to 37 and the gas-jetting holes 41 to 47 are formed such that gas-jetting holes 3$i$ and gas-jetting holes 4$i$ are alternately disposed along the X direction (first direction).

As described above, since the active gas-generating device according to the embodiment 2 has the above-described features, similarly to the embodiment 1, it is possible to jet a highly uniform active gas from the gas-jetting holes 31 to 37 and 41 to 47.

Further, as shown in FIGS. 5 and 6, the dielectric electrode 21B further includes a stepped part 51 (central region step part) for injecting port separation formed to protrude upward (+Z direction) in the central region R51. The stepped part 51 for injecting port separation is formed so as not to overlap with the gas-jetting holes 31 to 37 and 41 to 47 in plan view.

The stepped part 51 for injecting port separation is formed to extend between the gas-jetting holes 31 to 37 and the gas-jetting holes 41 to 47 in the X direction (first direction), from a stepped part 52 for flow straightening to a stepped part 53 for flow straightening, and has a central transverse stepped part 51c (third separation part) that separates the gas-jetting holes 31 to 37 and the gas-jetting holes 41 to 47 from each other.

The stepped part 51 for injecting port separation has six first hole separation stepped parts 51h (a plurality of first separation parts) each of which is formed along the +Y direction (second direction) starting from the central transverse stepped part 51c, and separates the gas-jetting holes 3i, 3 (i+1) (i=1 to 6) adjacent to each other from among the gas-jetting holes 31 to 37 (a first number of first jetting holes). Further, the stepped part 51 for injecting port separation has six second hole separation stepped parts 51l (a plurality of second separation parts) each of which is formed along the −Y direction starting from the central transverse stepped part 51c, and separates the gas-jetting holes 4i, 4 (i+1) (i=1 to 6) adjacent to each other from among the gas-jetting holes 41 to 47 (a second number of second jetting holes).

In addition, the stepped part 51 for injecting port separation further has end stepped parts 51t provided at both end parts in the X direction of the stepped part 51 for injecting port separation in order to fill spaces between the stepped part 51 for injecting port separation and the stepped parts 52, 53 for flow straightening.

As described above, the active gas-generating device according to the embodiment 2 is characterized by further including the stepped part 51 for injecting port separation having the central transverse stepped part 51i, the first hole separation stepped parts 51h, the second hole separation stepped parts 51l, and the end stepped parts 51t.

In the active gas-generating device according to the embodiment 2, the six first hole separation stepped parts 51h (the plurality of first separation parts) can suppress interference among the gas-jetting holes 31 to 37 (the first number of first jetting holes), and the six second hole separation stepped parts 51l (the plurality of second separation parts) can suppress interference among the gas-jetting holes 41 to 47 (the second number of second jetting holes).

Further, in the active gas-generating device according to the embodiment 2, the central transverse stepped part 51c (third separation part) can suppress interference between the gas-jetting holes 31 to 37 and the gas-jetting holes 41 to 47.

For example, due to existence of the central transverse stepped part 51c, a gas flow 8X (see FIG. 2) to be supplied from the −Y side to the gas-jetting holes 31 to 37 side, which may be generated in the embodiment 1, can be reliably avoided as shown in FIG. 6.

As a result, the active gas-generating device according to the embodiment 2 has the effect of being able to jet a more highly uniform active gas from the gas-jetting holes 31 to 37 and 41 to 47 (the plurality of jetting holes).

Figure 7:
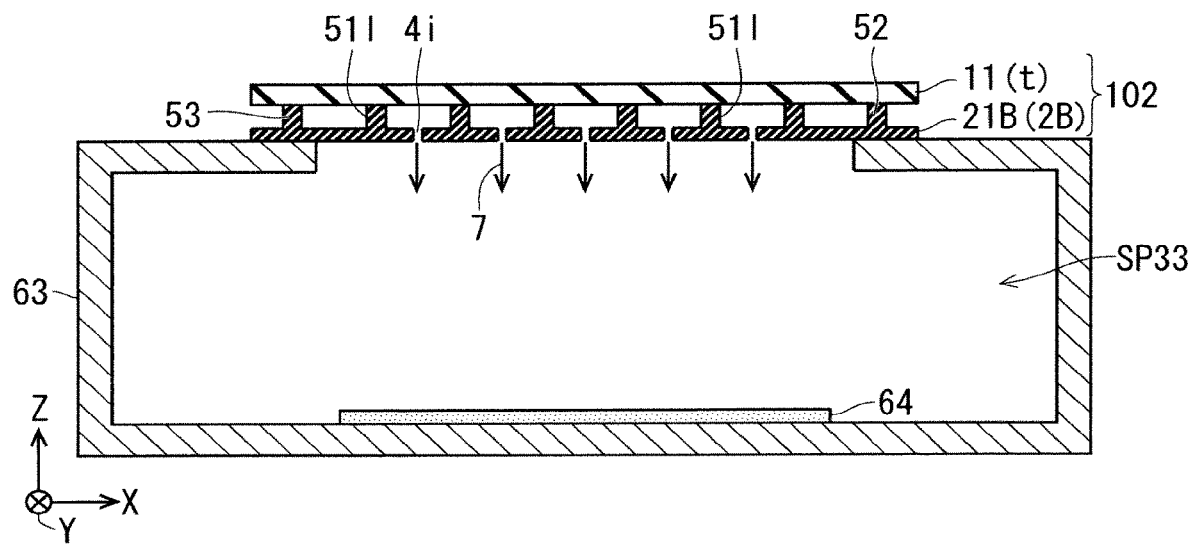
FIG. 7 is an illustration diagram schematically showing a cross-sectional structure of a film formation apparatus using the active gas-generating device according to the embodiment 2.
Figure 10:
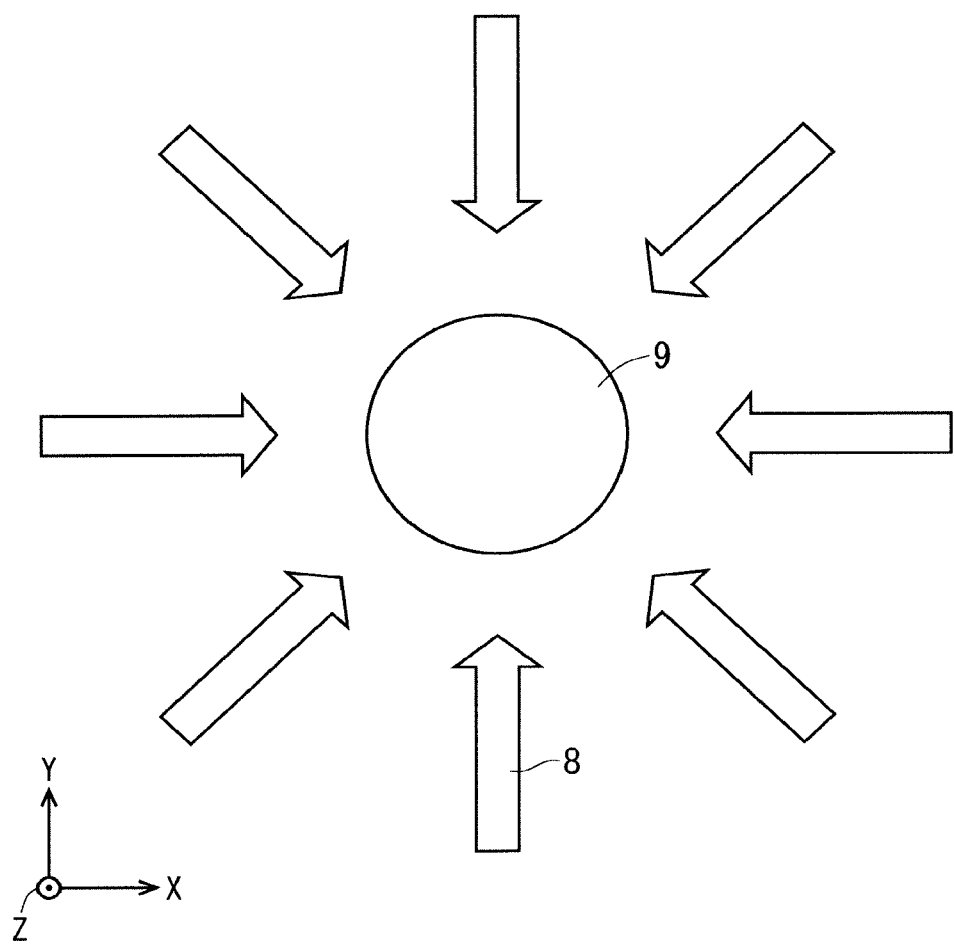
FIG. 10 is an enlarged illustration diagram showing a gas-jetting hole and the vicinity thereof shown in FIGS. 9A and 9B.
Figure 11A:
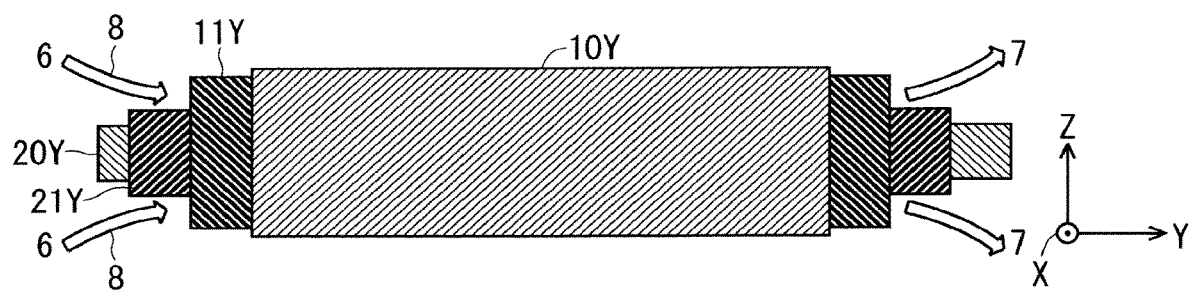
FIGS. 11A and 11B are illustration diagrams schematically showing a basic configuration of a conventional active gas-generating device adopting a cylindrical electrode structure.
Figure 11B:
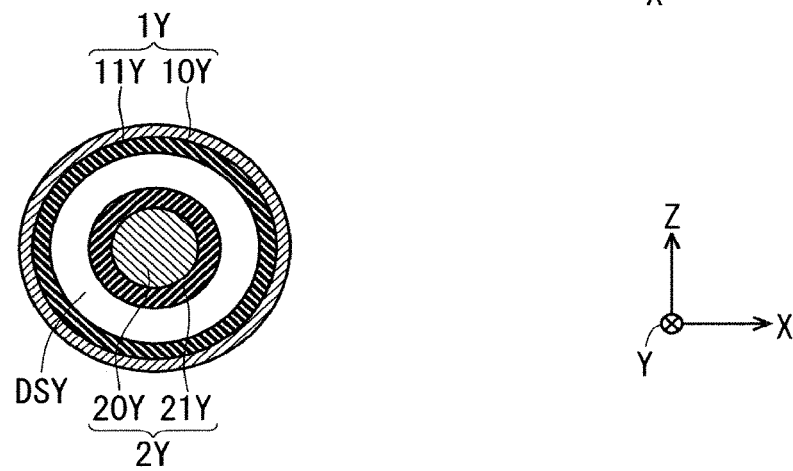

FIG. 7 is an illustration diagram schematically showing a cross-sectional structure of a film formation apparatus realized by using the active gas-generating device according to the embodiment 2. Note that even though FIG. 7 shows a cross-sectional view of the dielectric electrode 21B and the dielectric electrode 11 taken along line A-A in FIG. 6, for the purpose of appropriate simplification, for example, metal electrodes 20H, 20L and metal electrodes 10H, 10L to be described later, are not shown in the electrode-group constituent part 102.

With reference to FIGS. 6 and 7, the entire configuration of the active gas-generating device will be described. A film formation treatment chamber 63 accommodates a wafer 64, which is a substrate to be treated, on the bottom surface thereof, and functions as a substrate accommodating part for accommodating the wafer 64 in the treatment space SP63.

The electrode-group constituent part 102 including the high-voltage side electrode constituent part 1 and the ground side electrode constituent part 2B is a main part of the active gas-generating device according to the embodiment 2, and obtains the active gas 7 from the source gas 6 by using a discharge phenomenon to jet the active gas 7 from the gas-jetting holes 31 to 37 and 41 to 47 separately formed in the dielectric electrode 21B of the ground side electrode constituent part 2 toward the wafer 64 disposed in the treatment space SP63 of the film formation treatment chamber 63.

As described above, the film formation treatment chamber 63 is characterized by being disposed so as to directly receive the active gas 7 jetted from the gas-jetting holes 31 to 37 and 41 to 47 of the active gas-generating device according to the embodiment 2.

That is, the film formation apparatus shown in FIG. 7 includes the film formation treatment chamber 63 disposed below the ground side electrode constituent part 2B of the electrode-group constituent part 102 in the active gas-generating device according to the embodiment 2 and subjecting the wafer 64 (substrate to be treated) therein to a film formation treatment using the active gas 7. Thus, the wafer 64 in the treatment space SP63 of the film formation treatment chamber 63 can directly receive the active gas 7 jetted from the plurality of gas-jetting holes 31 to 37 and 41 to 47. Therefore, the film formation treatment chamber 63 can subject the wafer 64 to the film formation treatment using the active gas 7.

At this time, assuming that each of the formation lengths of the gas-jetting holes 31 to 37 and 41 to 47 in the X direction is LA, by making the formation length of the wafer 64 identical to the formation length LA and supplying the active gas 7 to the wafer 64 while moving the electrode-group constituent part 102 along the Y direction, the active gas 7 can be supplied to the entire wafer 64. Note that the electrode-group constituent part 102 may be fixed and the wafer 64 may be moved.

A case where the film formation treatment chamber 63 formed below the dielectric electrode 21B of the ground side electrode constituent part 2 has an orifice function will be considered. In this case, for example, the following environmental setting will be considered: "gas flow rate of the source gas: 4 slm; pressure on upstream side of the orifice (region before the source gas passes through the gas-jetting holes 31 to 37 and 41 to 47): 30 kPa, pressure on downstream side of the orifice (in the film formation treatment chamber 63): 266 Pa, the diameter of each of the gas jetting holes 31 to 37 and 41 to 47 (orifice): □ 1.3 mm; and the formation length of each of the gas jetting holes 31 to 37 and 41 to 47 (length in the Z direction, orifice length): 1 mm".

The film formation apparatus subjected to the above environmental setting can directly apply the active gas 7 to the wafer 64 in the film formation treatment chamber 63 provided immediately below, so that the active gas 7 having a higher density can be applied to the surface of the wafer 64, and a higher-quality film formation treatment can be achieved, which provides an effect of easily providing film formation having a high aspect ratio and three dimensional film formation.

In addition, it is desirable that, in the above film formation apparatus, the pressure in the discharge space in the active gas-generating device according to the embodiment 2 be set to 10 kPa to the atmospheric pressure, and the pressure in the film formation treatment chamber 63 be set to be equal to or less than the pressure in the discharge space.

Note that FIG. 7 shows an example in which the active gas-generating device according to the embodiment 2 is applied; however the active gas-generating device according to the embodiment 1 can exhibit the effects similar to those in the embodiment 2 by adopting the configuration in which the film formation treatment chamber 63 is disposed to directly receive the active gas 7 jetted from the gas-jetting holes 31 to 37 and 41 to 47.

<Other Aspects>

Hereinafter, other aspects of the active gas-generating devices according to the embodiments 1 and 2 will be described. Note that in the following aspects, with respect to the aspects common to the embodiment 1 and the embodiment 2, the embodiment 1 will be described as a representative in principle for convenience of explanation.

(First Aspect (Common to Embodiments 1 and 2))

FIG. 8 is an illustration diagram schematically showing a connection relationship among a high-voltage side electrode constituent part 1, a ground side electrode constituent part 2, and a high frequency power supply according to a first aspect. As shown in FIG. 8, the first aspect is characterized by having two high frequency power supplies 5H, 5L operating independently of each other.

As shown in FIG. 8, a metal electrode 20H (one-side second partial metal electrode) of the ground side electrode constituent part 2 is connected to the ground level on a high frequency power supply 5H side, and an AC voltage is applied from the high frequency power supply 5H to a metal electrode 10H (one-side first partial metal electrode) of the high-voltage side electrode constituent part 1.

In contrast, a metal electrode 20L (other-side second partial metal electrode) of the ground side electrode constituent part 2 is connected to the ground level on a high frequency power supply 5L side, and an AC voltage is applied from the high frequency power supply 5L to a metal electrode 10L (other-side first partial metal electrode) of the high-voltage side electrode constituent part 1.

For example, the high frequency power supplies 5H, 5L can fix a 0 peak value at 2 to 10 kV, and can apply an AC voltage set at a frequency of 10 kHz to 100 kHz between the metal electrodes 10H, 10L and the metal electrodes 20H, 20L. At this time, 0 peak value or frequency can be set different between the high frequency power supplies 5H, 5L.

By the application of the AC voltage from the high frequency power supply 5H (one-side AC voltage), a region where the metal electrode 10H overlaps with the metal electrode 20H in plan view is defined as a discharge space DSH (one-side discharge space), in a dielectric space in which the dielectric electrodes 11, 21 face each other.

Similarly, by the application of the AC voltage from the high frequency power supply 5L (other-side AC voltage), a region where the metal electrode 10L overlaps with the metal electrode 20L in plan view is defined as a discharge space DSL (other-side discharge space), in the dielectric space in which the dielectric electrodes 11, 21 face each other.

Therefore, a source gas 6 passing through the discharge space DSH between the metal electrode 10H and the metal electrode 20H is activated in the discharge space DSH, and is jetted as an active gas 7 mainly from gas-jetting holes 31 to 37. Similarly, a source gas 6 passing through the discharge space DSL between the metal electrode 10L and the metal electrode 20L is activated in the discharge space DSL, and is jetted as the active gas 7 mainly from gas-jetting holes 41 to 47.

As described above, the active gas-generating device according to the first aspect of the embodiments has the high frequency power supplies 5H, 5L provided independently of each other, the discharge space DSH (one-side discharge space) is formed by the application of the AC voltage (one-side AC voltage) from the high frequency power supply 5H, and the discharge space DSL (other-side discharge space) is formed by the application of the AC voltage (other-side AC voltage) from the high frequency power supply 5L.

Therefore, in the first aspect, since the discharge conditions can be changed between the discharge space DSH and the discharge space DSL, it is possible to supply two types of active gases 7 having different active states between the discharge space DSH and the discharge space DSL.

Second Aspect (Corresponding to Embodiment 2)

The active gas-generating device according to the embodiment 2 has the stepped part 51 for injecting port separation on the upper surface of the dielectric electrode 21B.

The gas-jetting holes 31 to 37 are provided in the direction of the metal electrode 10H and the metal electrode 20H with respect to the central transverse stepped part 51c (third separation part), and the gas-jetting holes 41 to 47 are provided in the direction of the metal electrode 10L and the metal electrode 20L with respect to the central transverse stepped part 51c. When the formation height of the central transverse stepped part 51c is set to the gap length in the discharge space DSL and the discharge space DSH, it is possible to completely separate the gas-jetting holes 31 to 37 and the gas-jetting holes 41 to 47 from each other.

Therefore, in the embodiment 2, as shown in parentheses in FIG. 8, by making the kinds of a source gas 6H (first source gas) supplied to the discharge space DSH and a source gas 6L (second source gas) supplied to the discharge space DSL differ from each other, it is possible to jet active gases 7H, 7L (first active gas and second active gas) different from each other. That is, it is possible to jet the active gas 7H obtained by passing the source gas 6H through the discharge space DSH, from the gas-jetting holes 31 to 37, and to jet the active gas 7L obtained by passing the source gas 6L through the discharge space DSL, from the gas-jetting holes 41 to 47.

Third Aspect (Common to Embodiments 1 and 2)

In each of the active gas-generating devices according to the embodiments 1 and 2, it is desirable that a gas contact region that is a region in contact with the active gas in the high-voltage side electrode constituent part 1 and the ground side electrode constituent part 2 (2B) be formed of quartz, or alumina as a constituent material.

Since the surface made of the above constituent material is a chemically stable substance against the active gas, in a third aspect, the active gas 7 can be jetted from the gas-jetting holes 31 to 37 and 41 to 47 in a state where deactivation of the active gas is suppressed on the gas contact region brought into contact with the active gas.

Fourth Aspect (Common to Embodiments 1 and 2)

In the active gas-generating devices according to the embodiments 1 and 2, as the source gas 6, a gas containing at least one of nitrogen, oxygen, fluorine, rare gas, and hydrogen, for example, is considered. These source gases 6 advance from an outer peripheral part of the electrode-group constituent part 101 to an inside along the gas supply direction D1 (D1H, D1L), and become the active gas 7 via the discharge spaces DSH and DSL inside. The active gas 7 (gas containing radicals) is jetted from the plurality of gas-jetting holes 31 to 37 and 41 to 47 provided in the dielectric electrode 21 (21B) to the treatment space SP63 (see FIG. 5) of the film formation treatment chamber 63 to be described later along the gas jetting direction D2. By using the highly reactive active gas in the film formation treatment chamber 63, the wafer 64, which is a substrate to be treated, can be subjected to a film formation treatment.

As described above, according a fourth aspect, the higher-density active gas 7 can be generated from the source gas 6 containing at least one of nitrogen, oxygen, fluorine, rare gas, and hydrogen.

Fifth Aspect (Common to Embodiments 1 and 2)

In the active gas-generating devices according to the embodiments 1 and 2, a modified configuration is also considered, in which the shapes (diameters) of the plurality of gas-jetting holes are set to be different from each other between the plurality of gas-jetting holes 31 to 37 and 41 to 47.

The above fifth aspect exhibits the effect of setting the jetting amount different between the plurality of gas-jetting holes 31 to 37 and 41 to 47.

Sixth Aspect (Common to Embodiments 1 and 2)

In the active gas-generating devices according to the embodiments 1 and 2, a precursor gas may be employed as the source gas 6 to be supplied.

By using the precursor gas as the source gas 6, the source gas 6 can be used as a reactive gas for surface treatment of the wafer 64 with high aspect ratio. In addition, the precursor gas to be a deposited material in film formation, the precursor gas being necessary for film formation on the wafer 64, can be also supplied to the surface of the wafer 64 to perform film formation.

Seventh Aspect (Mainly Corresponding to Embodiment 2)

It is desirable that the stepped parts 52, 53 for flow straightening and the stepped part 51 for injecting port separation formed on the upper surface of the dielectric electrode 21B according to the embodiment 2 also function as spacers defining a gap length (a distance in the Z direction between the dielectric electrode 11 and the dielectric electrode 21B) in the discharge space between the high-voltage side electrode constituent part 1 and the ground side electrode constituent part 2B.

Therefore, by the formation height of the stepped part 51 for injecting port separation according to a simple assembling process of laminating the high-voltage side electrode constituent part 1 on the ground side electrode constituent part 2B, the gap length in the discharge space can be set.

Note that also in the embodiment 1, the above-described effect can also be achieved by setting the gap length in the discharge space by the formation heights of the stepped parts 52, 53 for flow straightening.

<Others>

In the above-described embodiments 1 and 2, the dielectric electrode 21 (21B) has a flat plate structure having a rectangular shape in plan view. However, the shape of the dielectric electrode 21 (21B) is not particularly limited as long as the pair of metal electrodes 20H, 20L having rectangular shapes in plan view can be disposed on the bottom surface of the dielectric electrode 21 so as to face each other with the central region R51 of the dielectric electrode 21 (21B) therebetween in plan view, as shown in FIGS. 1, 4, and 5. For example, although the planar shape of the dielectric electrode 21 (21B) is basically rectangular, modification in which corners thereof are rounded may be added. The same applies to the dielectric electrode 11.

While the present invention has been described in detail, the foregoing description is in all aspects illustrative and the present invention is not limited thereto. It is understood that innumerable modifications not illustrated can be envisaged without departing from the scope of the present invention.

The invention claimed is:

1. An active gas-generating device generating an active gas obtained by activating a source gas supplied to a discharge space, the device comprising:
   a first electrode constituent part; and
   a second electrode constituent part that is provided below said first electrode constituent part, wherein an AC voltage is applied to said first electrode constituent part and said second electrode constituent part, and by application of said AC voltage, said discharge space is formed between said first electrode constituent part and said second electrode constituent part,
   wherein said first electrode constituent part includes a first dielectric electrode and a first metal electrode selectively formed on an upper surface of said first dielectric electrode, said second electrode constituent part includes a second dielectric electrode and a second metal electrode selectively formed on a bottom surface of said second dielectric electrode, and by the application of said AC voltage, a region where said first metal electrode and said second metal electrode overlap with each other in plan view is defined as said discharge space, in a dielectric space where said first dielectric electrode and said second dielectric electrode face each other,
   wherein said second metal electrode includes a pair of second partial metal electrodes formed so as to face each other with a central region of said second dielectric electrode interposed therebetween in plan view, an electrode formation direction of said pair of second partial metal electrodes is a first direction and a direction in which said pair of second partial metal electrodes face each other is a second direction intersecting with said first direction,
   wherein said first metal electrode includes a pair of first partial metal electrodes having a region overlapping with said pair of second partial metal electrodes in plan view,
   wherein said second dielectric electrode includes:
   a plurality of gas-jetting holes formed in said central region and jetting said active gas to an outside; and a pair of end region step parts formed along said second direction so as to protrude upward and provided at both end sides in said first direction with all said plurality of gas jetting holes interposed therebetween, said pair of end region step parts being formed so as to extend in said second direction beyond at least positions where said pair of second partial metal electrodes are formed in plan view, wherein said plurality of gas jetting holes includes:

a first number of first jetting holes, the first number being at least three, and the first number of the first jetting holes being formed at every first interval along said first direction; and a second number of second jetting holes, the second number being at least three, and the second number of the second jetting holes being disposed at a predetermined interval in said second direction from said first number of the first jetting holes, and being formed at every second interval along said first direction, and wherein said first number of the first jetting holes and said second number of the second jetting holes are formed such that the first jetting holes and the second jetting holes are alternately disposed along said first direction.

2. The active gas-generating device according to claim 1, wherein said second dielectric electrode further includes a central region step part that protrudes upward in said central region, the central region step part including:

a plurality of first separation parts each of which is formed along said second direction and separates first jetting holes adjacent to each other among said first number of the first jetting holes;

a plurality of second separation parts each of which is formed along said second direction and separates second jetting holes adjacent to each other among said second number of the second jetting holes; and a third separation part that is formed along said first direction and separates said first number of the first jetting holes and said second number of the second jetting holes from each other.

3. The active gas-generating device according to claim 1, wherein said AC voltage includes a one-side AC voltage and an other-side AC voltage independent from each other, and said discharge space includes a one-side discharge space and an other-side discharge space formed separately from each other, wherein said pair of first partial metal electrodes have a one-side first partial metal electrode and an other-side first partial metal electrode, and wherein said pair of second partial metal electrodes have a one-side second partial metal electrode and an other-side second partial metal electrode, by application of said one-side AC voltage, said one-side discharge space is formed between said one-side first partial metal electrode and said one-side second partial metal electrode, and by application of said other-side AC voltage, said other-side discharge space is formed between said other-side first partial metal electrode and said other-side second partial metal electrode.

4. The active gas-generating device according to claim 2, wherein said discharge space includes a one-side discharge space and an other-side discharge space formed separately from each other, wherein said pair of first partial metal electrodes have a one-side first partial metal electrode and an other-side first partial metal electrode, wherein said pair of second partial metal electrodes have a one-side second partial metal electrode and an other-side second partial metal electrode, said one-side discharge space is formed between said one-side first partial metal electrode and said one-side second partial metal electrode, and said other-side discharge space is formed between said other-side first partial metal electrode and said other-side second partial metal electrode, wherein said first number of the first jetting holes are provided in a direction of said one-side first partial metal electrode and said one-side second partial metal electrode with respect to said third separation part, and said second number of the second jetting holes are provided in a direction of said other-side first partial metal electrode and said other-side second partial metal electrode with respect to said third separation part, wherein said source gas includes a first source gas and a second source gas supplied independently from each other, and said active gas includes a first active gas and a second active gas, and wherein said first active gas obtained by passing said first source gas through said one-side discharge space is jetted from said first number of the first jetting holes, and said second active gas obtained by passing said second source gas through said other-side discharge space is jetted from said second number of the second jetting holes.

5. The active gas-generating device according to claim 1, wherein a gas contact region that is a region to be brought into contact with the active gas in said first electrode constituent part and said second electrode constituent part is formed to include one of quartz and alumina as a constituent material.

6. The active gas-generating device according to claim 1, wherein said source gas is a gas including at least one of nitrogen, oxygen, fluorine, rare gas, and hydrogen.

7. The active gas-generating device according to claim 1, wherein shapes of said plurality of gas-jetting holes are set to be different from one another among said plurality of gas jetting holes.

8. The active gas-generating device according to claim 1, wherein said source gas is a precursor gas.

9. The active gas-generating device according to claim 2, wherein by formation heights of said pair of end region step parts and said central region step part, a gap length in said discharge space is defined.

10. A film formation apparatus comprising:

the active gas-generating device according to claim 1; and a film formation treatment chamber that is disposed below said second electrode constituent part and subjects a substrate to be treated therein to a film formation treatment using the active gas, said film formation treatment chamber being disposed so as to directly receive said active gas jetted from said plurality of gas-jetting holes of said active gas-generating device.

* * * * *